US010302690B2

(12) United States Patent
Schweitzer, III et al.

(10) Patent No.: US 10,302,690 B2
(45) Date of Patent: *May 28, 2019

(54) TRAVELING WAVE BASED SINGLE END FAULT LOCATION

(71) Applicant: Schweitzer Engineering Laboratories, Inc., Pullman, WA (US)

(72) Inventors: Edmund O. Schweitzer, III, Pullman, WA (US); Armando Guzman-Casillas, Pullman, WA (US); Bogdan Z. Kasztenny, Markham (CA); Yajian Tong, Pullman, WA (US); Mangapathirao Venkata Mynam, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/884,707

(22) Filed: Jan. 31, 2018

(65) Prior Publication Data

US 2018/0196100 A1 Jul. 12, 2018

Related U.S. Application Data

(63) Continuation of application No. 15/806,959, filed on Nov. 8, 2017.
(Continued)

(51) Int. Cl.
*G01R 31/08* (2006.01)
*G01R 31/11* (2006.01)

(52) U.S. Cl.
CPC ............ *G01R 31/085* (2013.01); *G01R 31/11* (2013.01)

(58) Field of Classification Search
CPC ......... G01R 31/02; G01R 31/08–31/11; G01R 31/2836–31/2849; G01R 31/40
See application file for complete search history.

(56) References Cited

U.S. PATENT DOCUMENTS 3,585,298 A 6/1971 Liberman
3,670,240 A 6/1972 Maranchak
(Continued)

FOREIGN PATENT DOCUMENTS

EP 226210 12/1986
EP 241832 7/1990
(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Huy Q Phan
*Assistant Examiner* — David B Frederiksen
(74) *Attorney, Agent, or Firm* — Justin K. Flanagan; Richard M. Edge

(57) ABSTRACT

Traveling wave information from a single end of an electric power delivery system is used to determine a fault location on a power line of the electric power delivery system. Hypotheses of which of a plurality of received traveling waves represents a first reflection from the fault are evaluated. A determination of an arrival time of the first reflection from the fault is used to calculate a distance from the single end of the power line to the fault location.

23 Claims, 29 Drawing Sheets

Related U.S. Application Data

(60) Provisional application No. 62/420,977, filed on Nov. 11, 2016.

(56) References Cited

U.S. PATENT DOCUMENTS

| | | | |
|---|---|---|---|
| 3,753,086 A * | 8/1973 | Shoemaker, Jr. | G01R 31/021 324/523 |
| 3,878,460 A | 4/1975 | Nimmersjö | |
| 3,890,544 A | 6/1975 | Chamia | |
| 3,956,671 A | 5/1976 | Nimmersjö | |
| 4,053,816 A | 10/1977 | Nimmersjö | |
| 4,254,444 A | 3/1981 | Eriksson | |
| 4,296,452 A | 10/1981 | Eriksson | |
| 4,344,142 A | 8/1982 | Diehr | |
| 4,351,011 A | 9/1982 | Liberman | |
| 4,377,834 A | 3/1983 | Eriksson | |
| 4,499,417 A | 2/1985 | Wright | |
| 4,626,772 A | 12/1986 | Michel | |
| 4,766,549 A | 8/1988 | Schweitzer | |
| 4,797,805 A | 1/1989 | Nimmersjö | |
| 4,800,509 A | 1/1989 | Nimmersjö | |
| 5,198,746 A | 3/1993 | Gyugyi | |
| 5,272,439 A * | 12/1993 | Mashikian | G01R 31/1272 324/520 |
| 5,446,387 A | 8/1995 | Eriksson | |
| 5,572,138 A | 11/1996 | Nimmersjö | |
| 5,600,248 A * | 2/1997 | Westrom | G01R 31/088 324/522 |
| 5,682,100 A | 10/1997 | Rossi | |
| 5,729,144 A | 3/1998 | Cummins | |
| 6,341,055 B1 | 1/2002 | Guzman-Casillas | |
| 6,417,791 B1 | 7/2002 | Benmouyal | |
| 6,477,475 B1 | 11/2002 | Takaoka | |
| 6,597,180 B1 | 7/2003 | Takaoka | |
| 6,798,211 B1 | 9/2004 | Rockwell | |
| 7,174,261 B2 | 2/2007 | Gunn | |
| 7,535,233 B2 | 5/2009 | Kojovic | |
| 7,714,735 B2 | 5/2010 | Rockwell | |
| 7,733,094 B2 | 6/2010 | Bright | |
| 8,315,827 B2 | 11/2012 | Faybisovich | |
| 8,525,522 B2 | 9/2013 | Gong | |
| 8,598,887 B2 | 12/2013 | Bjorklund | |
| 8,655,609 B2 | 2/2014 | Schweitzer | |
| 8,781,766 B2 | 7/2014 | Schweitzer | |
| 8,990,036 B1 | 3/2015 | Schweitzer | |
| 9,470,748 B2 | 10/2016 | Schweitzer | |
| 9,594,112 B2 | 3/2017 | Schweitzer | |
| 9,627,881 B2 | 4/2017 | Schweitzer | |
| 2001/0012984 A1 | 8/2001 | Adamiak | |
| 2002/0118021 A1 * | 8/2002 | Saha | G01R 31/083 324/525 |
| 2002/0165462 A1 | 11/2002 | Westbrook | |
| 2004/0189317 A1 | 9/2004 | Borchert | |
| 2004/0230387 A1 | 11/2004 | Bechhoefer | |
| 2005/0151659 A1 | 7/2005 | Donovan | |
| 2006/0012374 A1 | 1/2006 | Kojovic | |
| 2008/0077336 A1 | 3/2008 | Fernandes | |
| 2009/0230974 A1 | 9/2009 | Kojovic | |
| 2011/0058285 A1 | 3/2011 | Wibben | |
| 2011/0173496 A1 | 7/2011 | Hosek | |
| 2011/0227581 A1 | 9/2011 | Kojovic | |
| 2011/0264388 A1 | 10/2011 | Gong | |
| 2012/0086459 A1 | 4/2012 | Kim | |
| 2013/0021039 A1 | 1/2013 | Bjorklund | |
| 2013/0096854 A1 | 4/2013 | Schweitzer | |
| 2013/0100564 A1 | 4/2013 | Zhang | |
| 2013/0116944 A1 * | 5/2013 | Seibel | G01R 31/08 702/58 |
| 2013/0241622 A1 | 9/2013 | Zerbe | |
| 2014/0074414 A1 | 3/2014 | Schweitzer, III | |
| 2015/0081236 A1 * | 3/2015 | Schweitzer, III | G01R 27/16 702/59 |
| 2016/0077149 A1 | 3/2016 | Schweitzer | |
| 2016/0077150 A1 | 3/2016 | Schweitzer | |
| 2016/0084893 A1 | 3/2016 | Schweitzer | |
| 2016/0216310 A1 * | 7/2016 | Schweitzer, III | G01R 31/088 |
| 2016/0266192 A1 * | 9/2016 | Burek | G01R 31/085 |
| 2017/0012424 A1 | 1/2017 | Schweitzer | |
| 2017/0082675 A1 | 3/2017 | Schweizer | |
| 2017/0146613 A1 | 5/2017 | Schweitzer | |
| 2017/0276718 A1 * | 9/2017 | Dzienis | G01R 31/086 |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012160089 Patent Cooperation Treaty, International Search Report and Written Opinion of the International Searching Authority, dated Feb. 5, 2013.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

PCT/US2014/055894 Patent Cooperation Treaty, International Search Report and Written Opinion of the International Searching Authority, dated Dec. 17, 2014.

PCT/US2014/055896 Patent Cooperation Treaty, International Search Report and Written Opinion of the International Searching Authority, dated Dec. 18, 2014.

PCT/US2014/055919 Patent Cooperation Treaty, International Search Report and Written Opinion of the International Searching Authority, dated Dec. 22, 2014.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

(56) References Cited

OTHER PUBLICATIONS

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

PCT/US2015/050504 Patent Cooperation Treaty, International Search Report and Written Opinion of the International Searching Authority, dated Jan. 29, 2016.

He, Baina, Yunwei Zhao, and Hengxu Ha. "A Novel Wave Based Differential Protection for Distributed Parameter Line." TELKOMNIKA Indonesian Journal of Electrical Engineering TELKOMNIKA 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

PCT/US2016/052329 Patent Cooperation Treaty, International Search Report and Written Opinion of the International Searching Authority, dated Jan. 6, 2017.

PCT/US2017/037345 Patent Cooperation Treaty, International Search Report and Written Opinion of the International Searching Authority, dated Aug. 24, 2017.

PCT/US2017/037288 Patent Cooperation Treaty, International Search Report and Written Opinion of the International Searching Authority, dated Aug. 28, 2017.

PCT/US2017/060800 Patent Cooperation Treaty, International Search Report and Written Opinion of the International Searching Authority, dated Jan. 23, 2018.

\* cited by examiner

*Calculation of Modal Offset*

| ENUM | MODE=CLARKE | MODE=PHASE |
|---|---|---|
| 1 | IALOFF | IALOFF |
| 2 | IBLOFF | IBLOFF |
| 3 | ICLOFF | ICLOFF |
| 4 | (IBLOFF-ICLOFF)/sqrt(3) | 0 |
| 5 | (ICLOFF-IALOFF)/sqrt(3) | 0 |
| 6 | (IALOFF-IBLOFF)/sqrt(3) | 0 |

FIG. 13

Interpolated ITPIs and Estimated Signed Magnitude IMAGs

| Index | ITP | ITPI | IMAG |
|---|---|---|---|
| 1 | 51074 | 51073.648 | 5.502 |
| 2 | 51344 | 51343.679 | -3.499 |
| 3 | 51398 | 51397.746 | 0.864 |
| 4 | 51613 | 51613.542 | -1.067 |
| 5 | 51668 | 51667.625 | -2.518 |
| 6 | 51830 | 51830.062 | -0.855 |
| 7 | 51883 | 51883.410 | -0.307 |
| 8 | 51938 | 51937.601 | 0.600 |
| 9 | 51992 | 51991.562 | -0.557 |
| 10 | 52100 | 52100.015 | 2.762 |
| 11 | 52207 | 52207.468 | 0.507 |
| 12 | 52262 | 52261.625 | 0.845 |

FIG. 14

TPK and VPK

| Index | TPK (ITPI) | VPK(IMAG) |
|---|---|---|
| 1 | 0 | 5.502 |
| 2 | 270.031 | -3.499 |
| 3 | 324.098 | 0.864 |
| 4 | 539.895 | -1.067 |
| 5 | 593.977 | -2.518 |
| 6 | 756.414 | -0.855 |
| 7 | 809.762 | -0.307 |
| 8 | 863.953 | 0.600 |
| 9 | 917.914 | -0.557 |
| 10 | 1026.367 | 2.762 |
| 11 | 1133.820 | 0.507 |
| 12 | 1187.977 | 0.845 |

FIG. 15

*Selected Hypotheses (within 2 * TWLPT + 10μs), based on TPSIGN (underlined and bold)*

| Index | TPK | VPK | TPSIGN |
|---|---|---|---|
| 1 | 0 | 5.502 | 1 |
| 2 | 270.031 | -3.499 | -1 |
| 3 | 324.098 | 0.864 | 1 |
| 4 | 539.895 | -1.067 | -1 |
| 5 | 593.977 | -2.518 | -1 |
| 6 | 756.414 | -0.855 | -1 |
| 7 | 809.762 | -0.307 | -1 |
| 8 | 863.953 | 0.600 | 1 |
| 9 | 917.914 | -0.557 | -1 |
| 10 | 1026.367 | 2.762 | 1 |
| 11 | 1133.820 | 0.507 | 1 |
| 12 | 1187.977 | 0.845 | 1 |

FIG. 16

*TWSEFL Ruler Match Results*

| Hyp. | F (H) [μs] | R (H) [μs] | NM (H) | N1_M (H) |
|---|---|---|---|---|
| 1 | 324.098 | 755.902 | 6 (Matches are underlined in the DT Vector) | 2 (Matches are double underlined in the DT Vector) |
| 2 | 863.953 | 216.047 | 3 | 5 |
| 3 | 1026.367 | 53.633 | 1 | 6 |

FIG. 17

Ruler Match Errors

| Hyp. | ERRM | ERR1_M | ERR |
|---|---|---|---|
| 1 | 0.465 | 0.945 | 1.410 |
| 2 | 0.238 | 1.683 | 1.921 |
| 3 | 0 | 2.578 | 2.578 |

FIG. 18

*Comparison between measured TPK and created Th for each hypothesis*

| Index | TPK (measurement) | Th(324.098) — Expected peaks for Hypothesis 1 | Th(863.953) — Expected peaks for Hypothesis 2 | Th(1026.367) — Expected peaks for Hypothesis 3 |
|---|---|---|---|---|
| 1 | 0 | 0 | 0 | 0 |
| 2 | 270.031 | 324.097 | 216.046 | 53.632 |
| 3 | 324.098 | 648.195 | 432.093 | 107.265 |
| 4 | 539.895 | 755.902 | 648.140 | 160.898 |
| 5 | 593.977 | 972.292 | 863.953 | 214.531 |
| 6 | 756.414 | 1080.000 | 864.188 | 268.164 |
| 7 | 809.762 | | 1080.000 | 321.796 |
| 8 | 863.953 | | 1080.234 | 375.429 |
| 9 | 917.914 | | | 429.062 |
| 10 | 1026.367 | | | 482.695 |
| 11 | 1133.820 | | | 536.328 |
| 12 | 1187.976 | | | 589.960 |
| 13 | | | | 643.593 |
| 14 | | | | 697.226 |
| 15 | | | | 750.859 |
| 16 | | | | 804.492 |
| 17 | | | | 858.125 |
| 18 | | | | 911.757 |
| 19 | | | | 965.390 |
| 20 | | | | 1019.023 |
| 21 | | | | 1026.367 |
| 22 | | | | 1072.656 |
| 23 | | | | 1080.000 |
| 24 | | | | 1126.289 |
| 25 | | | | 1133.632 |
| 26 | | | | 1179.921 |
| 27 | | | | 1233.554 |
| 28 | | | | 1287.187 |

FIG. 19

*Score Match Results*

| Hypothesis | NS (match points between expected Th and measured TPK) |
|---|---|
| 1 | 2 (324.098, 755.902) |
| 2 | 1 (863.953) |
| 3 | 4 (268.164, 321.796, 536.328, 589.960) |

FIG. 21

*Score Match Errors*

| Hyp. | ERR_S |
|---|---|
| 1 | 0.512 |
| 2 | 0 |
| 3 | 11.750 |

FIG. 22

*Weight and Corrected ERR_S for Each Hypothesis*

| Hyp. | F (H) | R (H) | Match of R(H) in TPK? | NS(H) | Weight WGHT(H) | Corrected ERR_S |
|---|---|---|---|---|---|---|
| 1 | 324.098 | 755.902 | Yes (=1) | 2 | NS(1)*1 = 2 | ERR_S(1)*1 = 0.512 |
| 2 | 863.953 | 216.047 | No (=0) | 1 | NS(2)*0 = 0 | ERR_S(2)*0 = 0 |
| 3 | 1026.367 | 53.633 | No (=0) | 4 | NS(3)*0 = 0 | ERR_S(3)*0 = 0 |

FIG. 23

*Total Per Unit Error for each Hypothesis*

| Hyp. | F(H) | N=NM+N1_M+NS | NM(H) | N1_M(H) | ERRpu |
|---|---|---|---|---|---|
| 1 | 324.098 | 10 | 6 | 2 | 0.192 |
| 2 | 863.953 | 8 | 3 | 5 | 0.240 |
| 3 | 1026.367 | 7 | 1 | 6 | 0.368 |

FIG. 24

TRAVELING WAVE BASED SINGLE END FAULT LOCATION

RELATED APPLICATION

This application is a continuation of U.S. patent application Ser. No. 15/806,959 filed on Nov. 8, 2017, titled "Traveling Wave Based Single End Fault Location" that claims priority under 35 U.S.C. § 119 to U.S. Provisional Patent Application No. 62/420,977 filed on Nov. 11, 2016, also titled "Traveling Wave Based Single End Fault Location," each of which is hereby incorporated by reference in its entirety.

TECHNICAL FIELD

This disclosure relates to determining a location of a fault using single-end traveling wave information in an electric power delivery system.

BRIEF DESCRIPTION OF THE DRAWINGS

This disclosure includes illustrative embodiments that are non-limiting and non-exhaustive. Reference is made to certain of such illustrative embodiments that are depicted in the figures described below.

FIG. 13 illustrates a table of a calculated modal offset value, IMOFF.

FIG. 14 illustrates a table with the interpolated arrival time stamps (ITPIs), and their corresponding estimated signed magnitudes, IMAG, for the simulation.

FIG. 15 illustrates a table with interpolated arrival times (TPKs) referenced to the arrival time (TPK) of the first received peak.

FIG. 16 illustrates a table showing the sign, TPSIGN, of each peak with respect to the first VPK based on the signed value VPK of each peak.

FIG. 17 illustrates a table showing the number matches within a set of time differences of pair-combinations of TPK values for the F(H) and the R(H) of each hypothesis.

FIG. 18 illustrates a table showing calculated total errors for NM(H) and N1_M(H) within a TWTOL1 parameter.

FIG. 19 illustrates a table showing the first reflection from the fault underlined, the first reflection from remote station double underlined, and filtered values in strikethrough.

FIG. 21 illustrates a table showing the scores, NS(H), based on TPK matches with the ETWs for each hypothesis.

FIG. 22 illustrates a table of the total errors for the scores, NS(H), within a 5 µs threshold range.

FIG. 23 is a table showing a weight, WGHT(H), assigned to each of three hypotheses based on an R(H) match with a received TPK value and the NS(H) of each hypothesis.

FIG. 24 includes a table with N values and the total per unit error, ERRpu, for each of the three hypotheses.

DETAILED DESCRIPTION

Figure 1A:
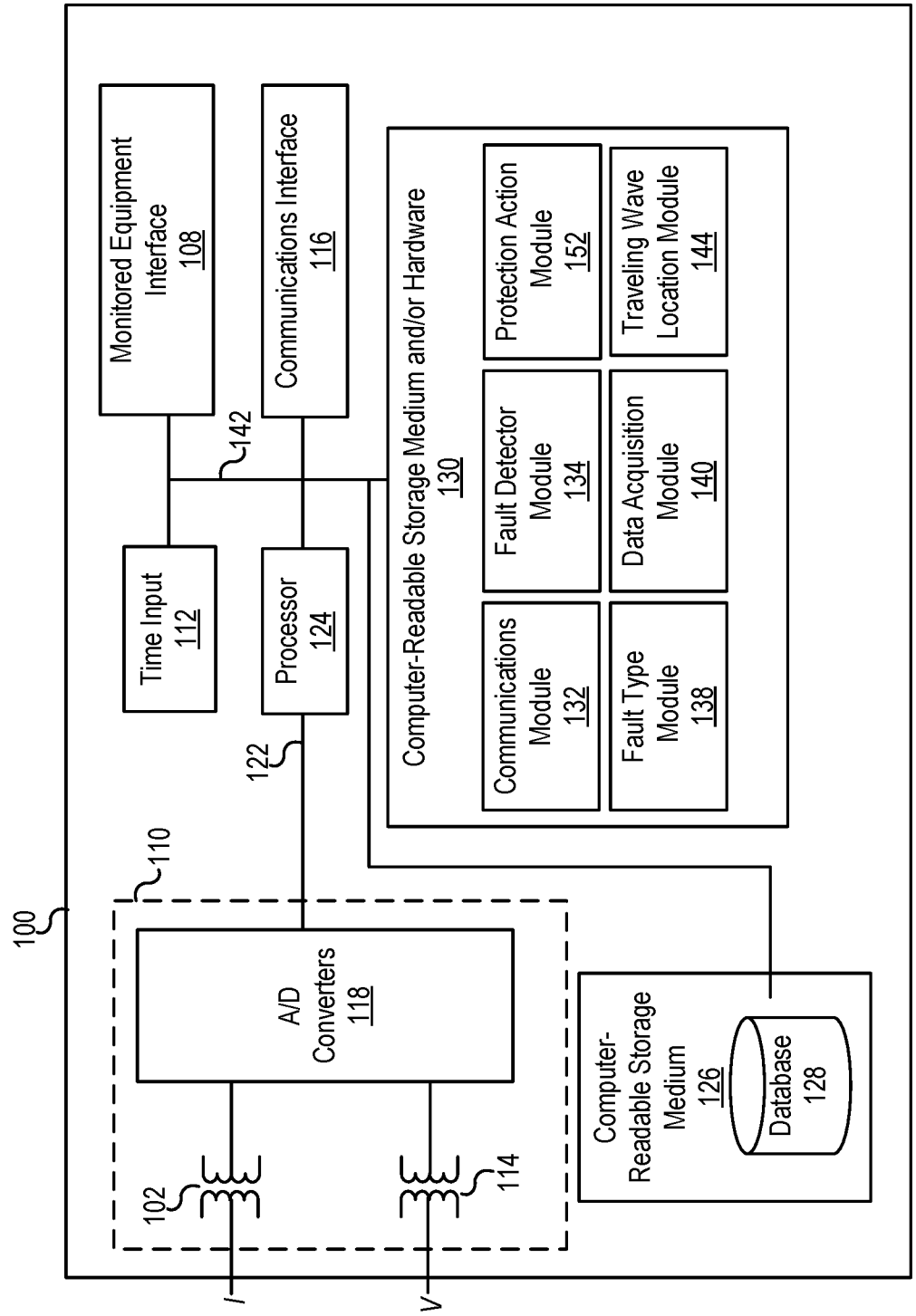
FIG. 1A illustrates an example of an intelligent electronic device (IED), according to several of the embodiments described herein.

The systems and methods described herein relate to determining a location of a fault in an electric power delivery system based on measurements from a single end of the electric power delivery system. Any of a wide variety of systems and methods may be used to obtain current and/or voltage measurements from an electric power delivery system. The system may calculate traveling wave information, such as polarity, magnitude, and/or time of traveling waves observed at a local end (i.e., first location) of the electric power delivery system. The system may identify a plurality of the received traveling waves as being potentially the first received reflection from the fault location.

A traveling wave detector, comprising software, hardware, and/or a combination thereof may be configured to detect arrival times (TPKs) of traveling wave peaks (VPKs). Each of the plurality of TPKs associated with the VPKs that match a polarity of the first received VPK may be considered and evaluated (i.e., considered as a hypothesis) to determine if it corresponds to the arrival time of the first received traveling wave peak reflection from the fault location.

The system may utilize one or more types of fault location information, including any one or combination of (i) multi-end traveling wave fault location information, (ii) multi-end impedance-based fault location information, and (iii) single-end impedance-based fault location information to establish an initial guess, m_ini, of a location of the fault.

For example, if multi-end traveling wave fault location information is available, an initial estimate of the fault location, m_ini, may be made based on the multi-end traveling wave information; otherwise, if multi-end impedance-based fault location is available, an initial estimate of the fault location, m_ini, may be made based on the multi-end impedance-based fault location; otherwise, if single-end impedance-based fault location information is available, an initial estimate of the fault location, m_ini may be made based on the single-end impedance-based fault location information.

If none of these three types of fault location information types are available, an initial estimate of the fault location, m_ini, may be assigned by default. For example, m_ini may be set equal to 0.5 in per unit length. In some cases, the single-end traveling wave fault location method may use the initial estimate to determine a possible faulted section.

Generally speaking, traveling waves couple between faulted and healthy phases as they travel along the line in two sets of aerial modes (alpha and beta) and a ground mode. The alpha mode can be a good representation of the three phase traveling waves for ground faults and can be calculated for any faulted phase. The beta mode can be a good representation of the three phase traveling waves for phase to phase faults. The mode (alpha or beta) with the highest current magnitude (or alternatively, voltage in some embodiments) may be used. In some embodiments, a specific mode may be used to detect a specific fault type (e.g., if a fault type is known or identified by a fault detection system).

As described below, arrival times (TPKs) of traveling wave peaks (VPKs,) received at a local terminal may be used to calculate a fault location. The system may identify the reflection path of VPKs detected at the local terminal by matching patterns and/or expected arrival times based on an evaluation of hypotheses, where each hypothesis is considered as a potential TPK corresponding to the VPK from the first reflection from the fault location back to the local terminal. A hypothesis for the fault location that results in accurate predictions of traveling wave peak arrival times (TPKs of VPKs) can be used to calculate an exact or approximate fault location relative to the local terminal.

In various embodiments, a ruler evaluation (i.e., a repeating travel time "RTT" evaluation) can be used to evaluate each hypothesis based on the expected and received traveling waves. In other embodiments, a score evaluation (i.e., an expected traveling wave "ETW" evaluation) approach can be used to evaluate each hypothesis based on the expected and received traveling wave. In still other embodiments the ruler (RTT) and score (ETW) methods may be used in combination.

In some embodiments, the hypotheses may be weighted and evaluated based on the degree of match (i.e., an error rate) between calculated or expected traveling waves and measured or received traveling waves. Hypotheses may be rejected based on the number of matches being below a threshold (such as where the number of matches is zero). A fault location can be calculated based on the hypotheses with expected reflections that most closely match received reflections.

The systems and methods described and illustrated herein may be implemented in hardware specifically configured for the monitoring and protection of electric power delivery systems. In one embodiment, the systems and methods herein may be implemented as intelligent electronic devices (IEDs) in communication with the electric power delivery system. An IED according to several embodiments herein may include inputs for receiving electric power system signals corresponding with the electric power delivery system. For example, the IED may include an input in electrical communication with a current transformer, potential transformer, or other similar device configured to obtain electric power system signals from a portion of the electric power delivery system and transmit the signals to the IED.

Additional understanding of the embodiments of the disclosure can be gained by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified or contextually required.

FIG. 1A illustrates an example of an IED 100 according to several of the embodiments described herein. The IED 100 includes a voltage input for receiving electric power system signals from a potential transformer or the like, and a current input for receiving electric power system signals from a current transformer or the like. The signals may be received by a signal processing module 110 that may include transformers 102, 114, A/D converter(s) 118, filters, and the like to produce electric power system signals useful for the processor 124 via bus 122. The IED 100 may include a time input 112 configured to receive a common time signal among a certain subset of IEDs and other devices. The common time signal may be a global navigation satellite system (GNSS) time signal, a terrestrial common time signal, a network time signal, or the like.

The IED 100 may include a monitored equipment interface 108 for communication with power system equipment. The monitored equipment interface 108 may be configured to interface with a circuit breaker, recloser, capacitor bank, voltage regulator, reactor, or the like for controlling operation of the equipment. The IED 100 may include a communications interface 116 for communication with other IEDs, or other devices. In one embodiment, IED 100 may be in communication with local equipment at a local location of the electric power system via the voltage and current inputs, while being in communication via the communication interface 116 with another IED at a remote location of the electric power delivery system. Thus, IED 100 may obtain electric power system conditions, operation information, and other communications related to a remote location of the electric power delivery system.

The IED 100 may include a computer-readable storage medium 126 for permanent and temporary storage of information. The computer-readable storage medium 126 may include a database 128, that may be a repository of settings, thresholds, and the like, useful for the operation of the IED 100. The IED 100 may further include a computer-readable storage medium 130 that includes several operating modules that when executed on the processor 124 cause the IED 100 to perform certain functions related to the monitoring and protection of the electric power delivery system. Each of the signal processing module 110, computer readable storage media 126, 130, time input 112, monitored equipment interface 108, communications interface 116, processor 124, and other modules may be in communication using a data bus 142.

The computer-readable storage medium 130 may include several modules operable on the processor 124. One such module may be a communication module 132 that includes instructions related to the transmission and receipt of communications. The fault detector module 134 may include instructions related to detecting faults on the electric power delivery system using measurements obtained by the signal processing module 110 and/or from another IED via the communications interface 116. The fault type module 138 may be configured to determine a fault type (e.g. single-phase, multiple-phase, phase-to-phase, phase-to-ground, and the like) from available fault information. The data acquisition module 140 may include instructions related to treatment of the signals from the signal processing module 110 to produce data useful for other modules.

The traveling wave location module 144 may include instructions and/or electrical components to implement several of the systems, subsystems, and operations described herein. For example, traveling wave location module may be configured to locate a fault using traveling waves from a single end of the electric power delivery system. The traveling wave location module 144 may be embodied within the computer-readable storage medium 130 and/or implemented as a stand-alone IED with subcomponents, modules, and inputs implemented in software, firmware, and/or hardware.

The protection action module 152 may include instructions for taking a protective action based on a detected fault and fault location. For example, for a fault within a selected zone of protection, the protection action module 152 may be configured to command a circuit breaker to open (via the monitored equipment interface 108) to clear a fault.

A fault locator system may utilize a traveling wave single-end fault location (TWSEFL) algorithm to estimate a fault location using single-end traveling wave measurements and evaluations. The TWSEFL algorithm may use fault location estimations from the multi-end traveling wave fault location (TWMEFL) information and/or impedance-based fault location (ZFL) algorithms to develop an initial guess, m_ini. If the estimations of TWMEFL algorithm or ZFL algorithm are not available, the TWSEFL algorithm can still be used to estimate the fault location based on the traveling wave arrival times at a local terminal using an initial guess, m_ini, set to a default value (e.g., 0.5 in per unit length).

Figure 1B:
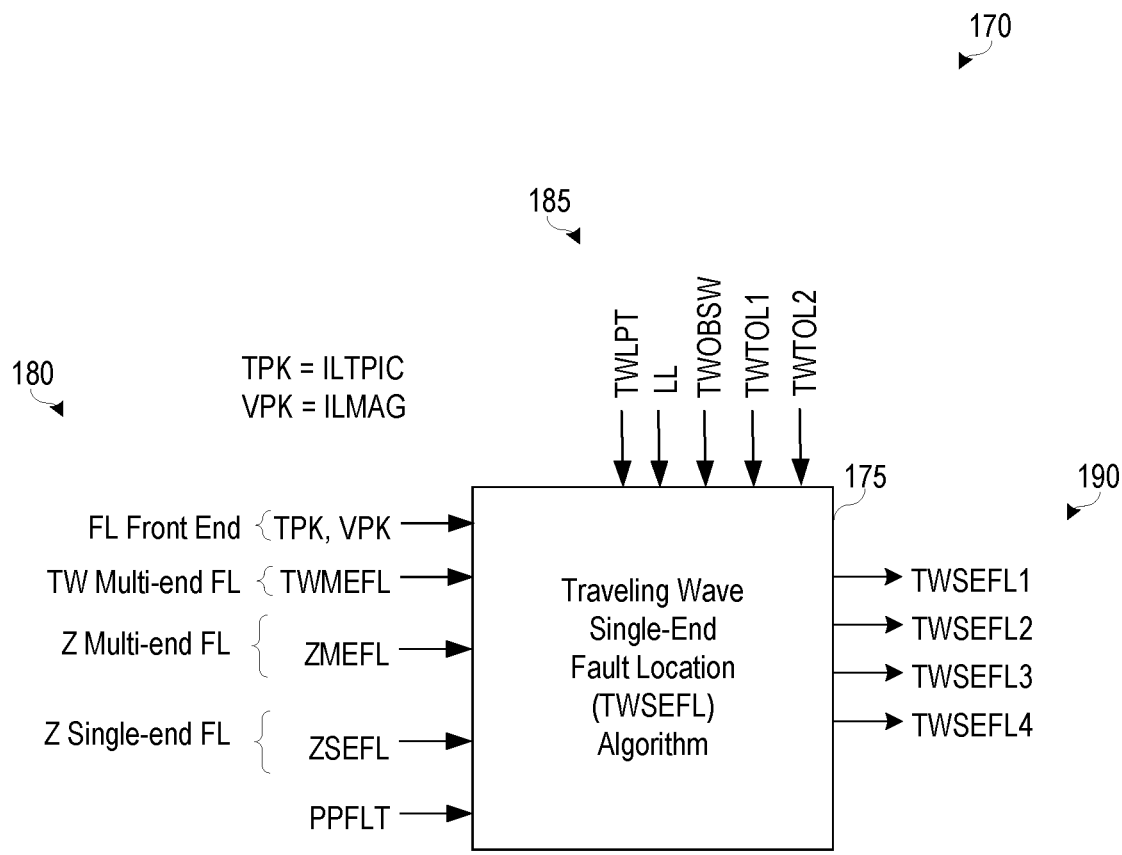
FIG. 1B illustrates a block diagram of the inputs, parameters, and outputs of a single-ended traveling wave fault location system, such as may be implemented by the IED in FIG. 1A.

FIG. 1B illustrates a block diagram 170 of the inputs 180, parameters 185, and outputs 190 of the TWSEFL algorithm 175 that may be implemented by a fault locator system (e.g., IED 100 in FIG. 1A, as part of traveling wave location module 144 in FIG. 1A, and/or as an independent system). Inputs 180 may include any combination of: a vector of peak times (TPK or ILTPIC), a traveling wave based multi-end fault location (TWMEFL) estimate, an impedance-based multi-end fault location (ZMEFL) estimate, an impedance-based single-end fault location (ZSEFL) estimate, and a phase-to-phase fault (PPFLT) indicator.

Parameters 185 may include any combination of: traveling wave line propagation time (TWLPT), line length (LL), single-ended traveling wave fault location observation window factor (TWOBSW), single-ended traveling wave fault location observation window 1 (TWTOL1), and single-ended traveling wave fault location observation window 2 (TWTOL2). In some embodiments, some parameters may be user-input based on system conditions and some parameters may be dynamically calculated by the system instead of provided as an input. For example, the TWOBSW may be automatically set to 2.4, such that the observation window is equal to 2.4 times a TWLPT parameter. Similarly, the TWLPT parameter may be input as a parameter and/or may be automatically calculated based on an input LL and known system conditions/materials. Outputs 190 of the TWSEFL algorithm may include one or more traveling wave based single-end fault location estimations (TWSEFL1, TWSEFL2, TWSEFL3, and TWSEFL4). Alternatively, a single traveling wave single-ended fault location, TWSEFL, may be output based on the hypothesis determined to be most accurate.

Figure 2:
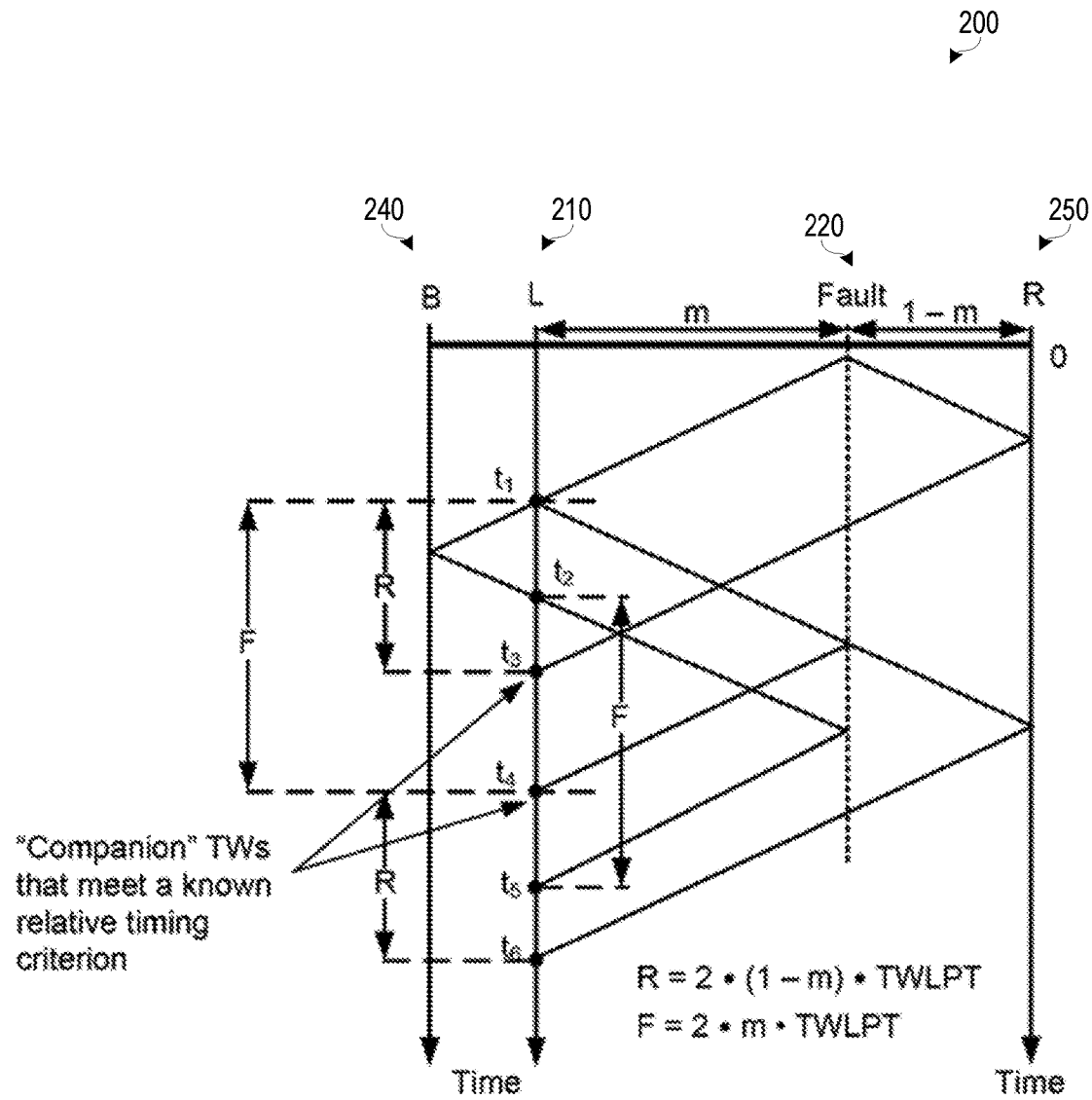
FIG. 2 illustrates an example of a Bewley lattice diagram that includes a substation, local terminal, fault location, and a remote terminal.

FIG. 2 illustrates a Bewley lattice diagram 200 that includes a local terminal, L, 210 and a remote terminal, R, 250 that are 1 line length unit apart. A fault at location 220 is at a relative distance m (per unit) from the local terminal 210 and a relative distance 1-m from the remote terminal 250. A substation B 240 is also shown. The Bewley lattice diagram 200 illustrates the traveling current waves from the fault location 220 and the various reflections from the local terminal 210 and the remote terminal 250.

$t_1$ is the arrival time (i.e., TPK) of the first received traveling wave from the fault at location 220. $t_2$ is the arrival time of a traveling wave from the substation 240 behind the local terminal 210. $t_3$ is the arrival time of a traveling wave that traveled from the fault at location 220 to the remote terminal 250 and was reflected back to the local terminal 210. $t_4$ is the arrival time of the first traveling wave after having been reflected by the local terminal 210, back to the fault at location 220, and then back to the local terminal 210. $t_5$ is related to reflections between the substation 240 and the fault at location 220. Finally, $t_6$ is the arrival time of a traveling wave that traveled from the fault at location 220 to the local terminal 210, from the local terminal 210 to the remote terminal 250, and from the remote terminal 250 back to the local terminal 210.

The arrival times of $t_3$ and $t_4$ are considered "companion traveling waves" because the relative time between their arrival times (TPKs) is calculatable based, at least in part, on the distance between the local terminal 210 and the remote terminal 250. By identifying the origin or reflection path of received traveling waves and/or traveling wave patterns, the system can estimate an accurate distance between the local terminal 210 and the location of the fault 220.

The fault at location 220 is a distance m (in per unit length) from the local terminal 210, so the first traveling wave is received at time $t_1$ that is equal to m*TWLPT. Another traveling wave should return from the remote terminal 250 at the time $t_3$ that is equal to (2−m)*TWLPT. The difference between these two times is 2*(1−m)*TWLPT. Thus, one "companion traveling wave" is expected at $t_1$+2*(1−m)*TWLPT, which is equal to $t_3$. The first reflection from the fault is expected at time $t_4$, which is equal to $t_1$+2*m*TWLPT.

The timing and polarities of the traveling waves that are spaced by 2*m*TWLPT and 2*(1−m)*TWLPT may be evaluated. Each reflection from a discontinuity behind the local terminal 210 (e.g., from substation 240) may generate a traveling wave (a "test traveling wave") toward the fault. Consequently, the system may expect multiple pairs of traveling waves that are spaced by 2*m*TWLPT. Multiple possible traveling wave pairs may be evaluated to identify the distance to the fault, m. The time distance between pairs of traveling waves that occurs most frequently may be determined to be equal to 2*m*TWLPT.

The system may implement the TWSEFL algorithm by identifying a plurality of valid traveling waves at the local terminal 210 that are within an observation window that is at least two times the TWLPT (e.g., 2.4*TWLPT). The first TPK value at $t_1$ may be referred to as TPK(0).

Figure 3:
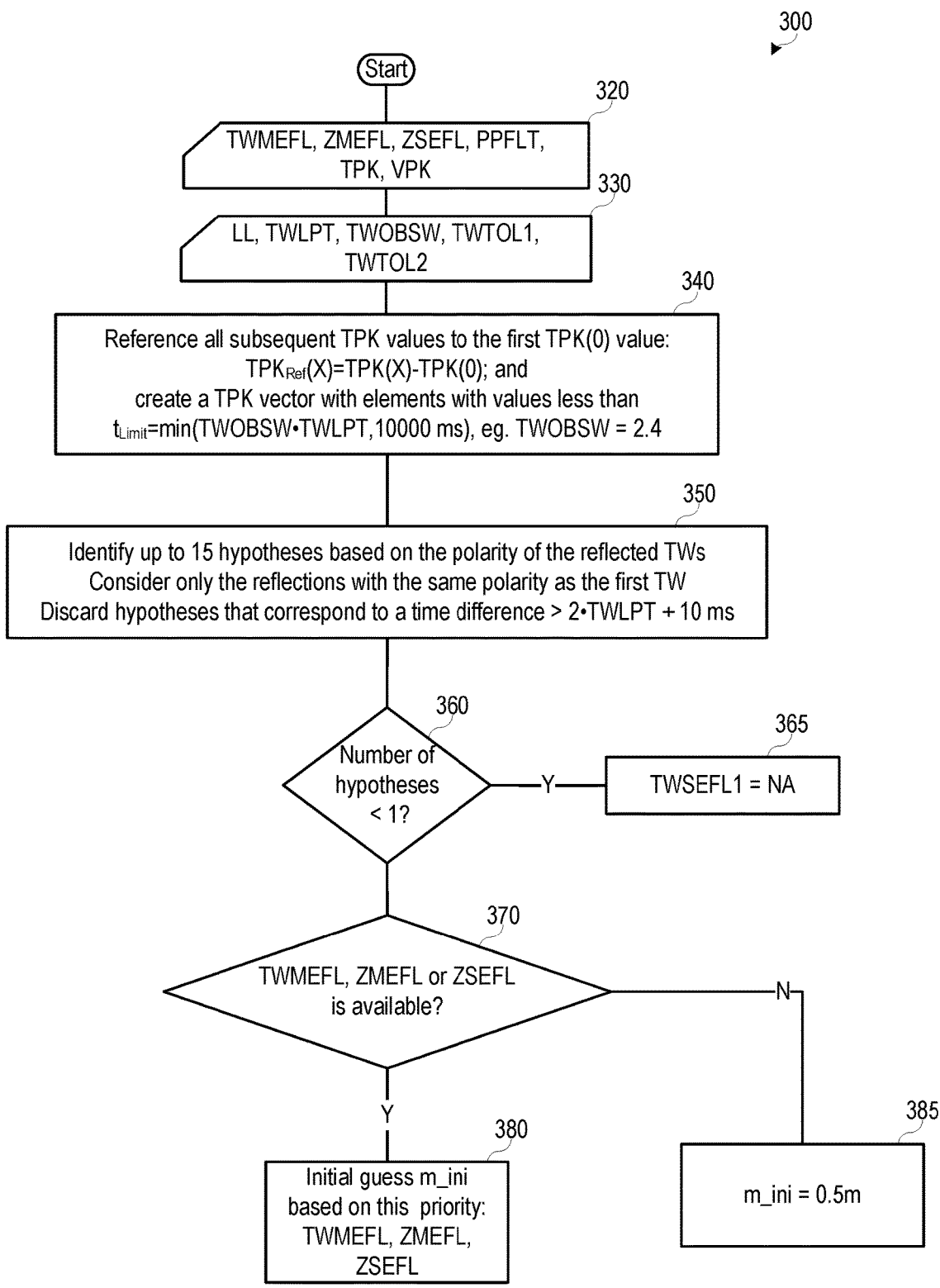
FIG. 3 illustrates a flowchart including inputs and parameters for performing operations of a method for calculating a fault location.

FIG. 3 illustrates inputs 320 and parameters 330 received for performing operations of a method 300 to calculate a fault location. For example, a fault location system may implement the TWSEFL algorithm by identifying arrival times (TPKs) (i.e., time stamps) of traveling wave amplitude peaks (VPKs) of traveling waves that correspond to the mode that includes the maximum amplitude within an observation window defined by a function of the TWOBSW parameter and the TWLPT (e.g., TWOBSW*TWLPT). For example, the TWOBSW may be 2.4 such that the observation window is equal to 2.4 times the traveling wave line propagation time, TWLPT.

A first TPK value corresponding to the first received VPK within the observation window can be used as a reference traveling wave, and all other TPK values can be referenced, at 340, with respect to TPK(0), such that for each of the TPK values TPK(0) to TPK(n), a referenced TPK value can be calculated as follows for each value of X for X=0 to n where n is the number of reflections:

$$TPK_{Ref}(X)=TPK(X)-TPK(0) \quad \text{Equation 1}$$

A TPK vector (or set of TPK values) can be formed that includes the referenced TPK values below a threshold, $t_{limit}$. Input parameters 330 can used to establish the threshold, $t_{limit}$, as, for example:

$$t_{limit}=\min(TWOBSW*TWLPT,10000\ \mu s) \quad \text{Equation 2}$$

A set of hypotheses, $H_1$-$H_n$, may be generated based on the values in the TPK vector corresponding to VPKs that have the same polarity as the VPK corresponding to TPK(0). In some embodiments, up to 15 hypotheses (or other arbitrary maximum number of hypotheses) may be initially considered, at 350, as hypotheses for calculating the fault location. The system evaluates each of a plurality of hypothesis TPK values to determine if a hypothesis TPK value corresponds to the first VPK associated with a reflection from the fault. Identify a TPK value as corresponding to the arrival time of a VPK of the first traveling wave reflection from the fault allows for an accurate hypotheses that have a time difference relative to TPK(0) greater than a function of the TWLPT may be discarded. For example, hypotheses that have a time difference relative to TPK(0) greater than 2·TWLPT+10 microseconds may be discarded. If no hypotheses exist, at 360, then no estimated TWSEFL may be generated, at 365.

If there are a plurality of hypotheses and inputs for TWMEFL, ZMEFL or ZSEFL are available, at 370, then one or more of the inputs for TWMEFL, ZMEFL or ZSEFL may be used to as an initial estimate of a fault location, m_ini. In various embodiments, the following priority may be utilized for determining, at 380, an initial estimate of the fault location, m_ini: TWMEFL, ZMEFL, and then ZSEFL. In other embodiments, a different priority may be utilized and/or a weighted average of estimates based on one or more of TWMEFL, ZMEFL, and ZSEFL. If none of TWMEFL, ZMEFL or ZSEFL is available, at 370, then a default initial estimate may be used, at 385 (e.g., the middle of the line).

Figure 4:
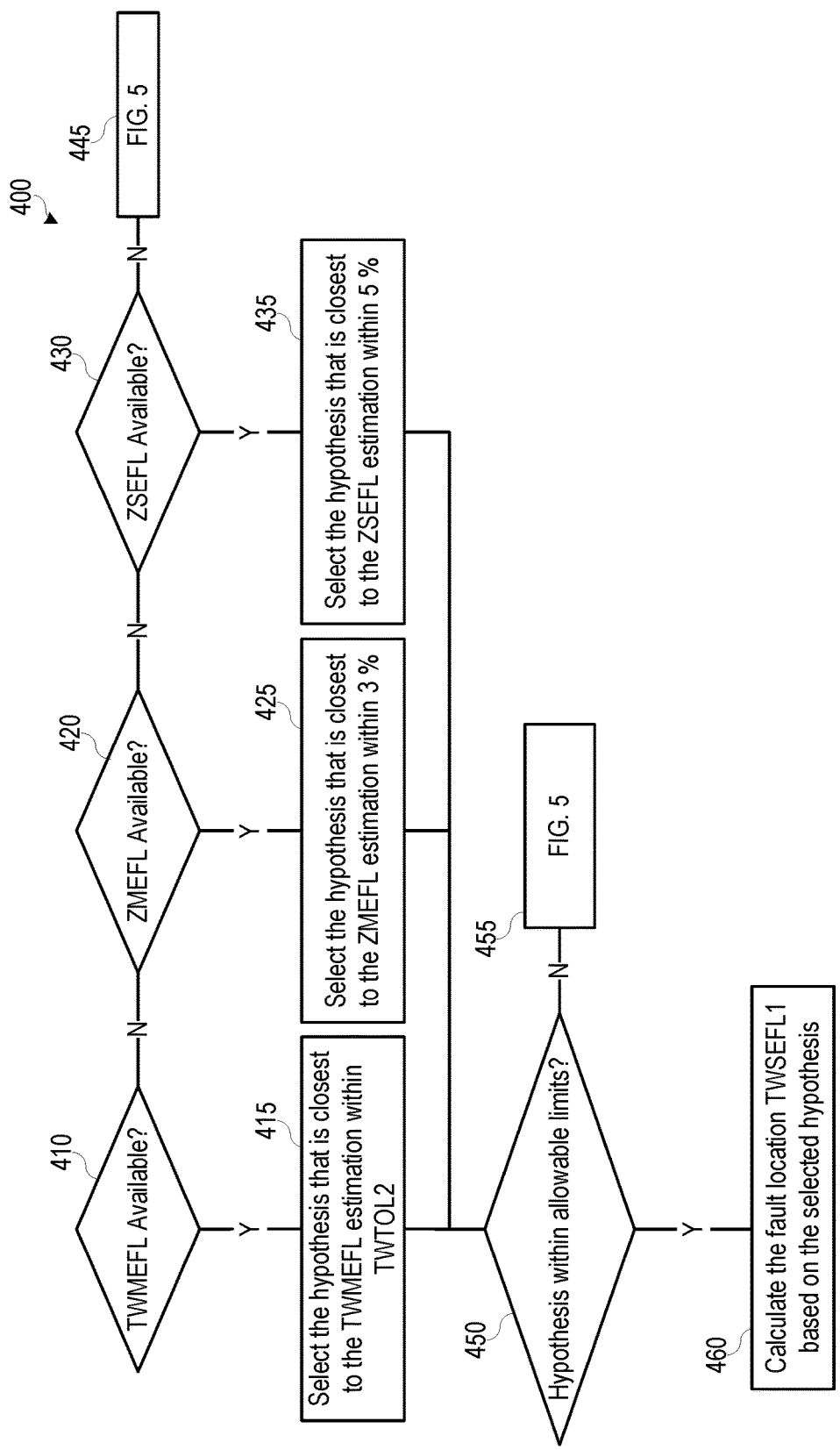
FIG. 4 illustrates a flowchart of an example of a method for calculating a fault location.

FIG. 4 illustrates an example of a method 400 of one embodiment of calculating a fault location TWSEFL1. As described above, if TWMEFL is available, at 410, then the hypothesis for the fault location (based on a hypothesis TPK as described herein) that is closest to the TWMEFL estimation is used, if it is within the TWTOL2 parameter, at 415. If a TWMEFL estimation is not available, at 410, but a ZMEFL estimate is available, at 420, then the system may utilize the hypothesis TPK that results in a fault location calculation that is within a predetermined range (e.g., 3%) of the ZMEFL estimate, at 425. If both the TWMEFL and ZMEFL estimations are unavailable, but a ZSEFL estimation is available and a phase-to-phase fault is indicated, at 430, then the hypothesis that results in a fault location calculation within a predetermined range (e.g., 5%) of the ZSEFL estimate may be utilized.

As long as the hypothesis are within allowable limits, at 450, based on input parameters, then the selected hypothesis is used to calculate the fault location TWSEFL1, at 460. If none of the three estimations (TWMEFL, ZMEFL, and ZSEFL) are available, at 445, and/or none of the hypotheses are within allowable limits, at 455, then a fault location may be estimated based on a selected hypothesis TPK as described below.

In other embodiments, estimates and/or inputs from TWMEFL, ZMEFL, and/or ZSEFL may not be provided and/or considered in determining a fault location. In such instances, a fault location may be calculated based on a selected hypothesis as described below.

Figure 5:
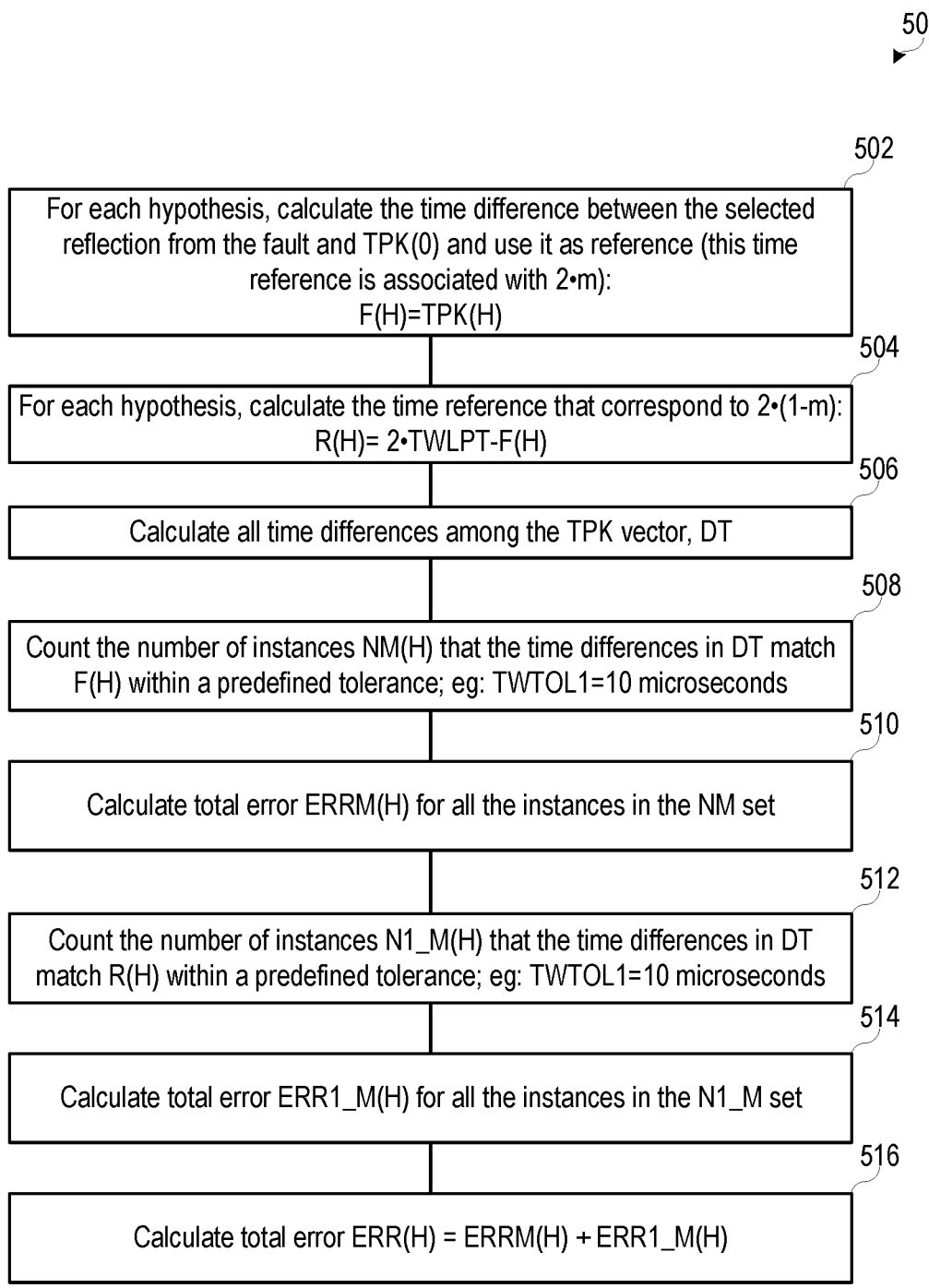
FIG. 5 illustrates a flowchart of portion of a method for calculating a fault location.

FIG. 5 illustrates a portion of a method 500 for calculating a fault location using a ruler evaluation approach, also referred to as a repeating travel time RTT evaluation approach. For each hypothesis TPK, a fault reflection value corresponding to 2*m may be calculated, at 502, as the difference between the hypothesis TPK value and TPK(0), where TPK(0) is the arrival time of the first received traveling wave peak (VPK). For a given hypothesis, H, the equation may be represented as:

$$F(H)=TPK(H)-TPK(0). \quad \text{Equation 3}$$

For each hypothesis, H, a remote reflection value corresponding to the arrival time (TPK) of a traveling wave peak (VPK) from a remote location (e.g., the second end of the power line) may be calculated, at 504, for a given hypothesis, H, that corresponds to 2*(1−m) as:

$$R(H)=2*TWLPT-F(H). \quad \text{Equation 4}$$

Figure 6A:
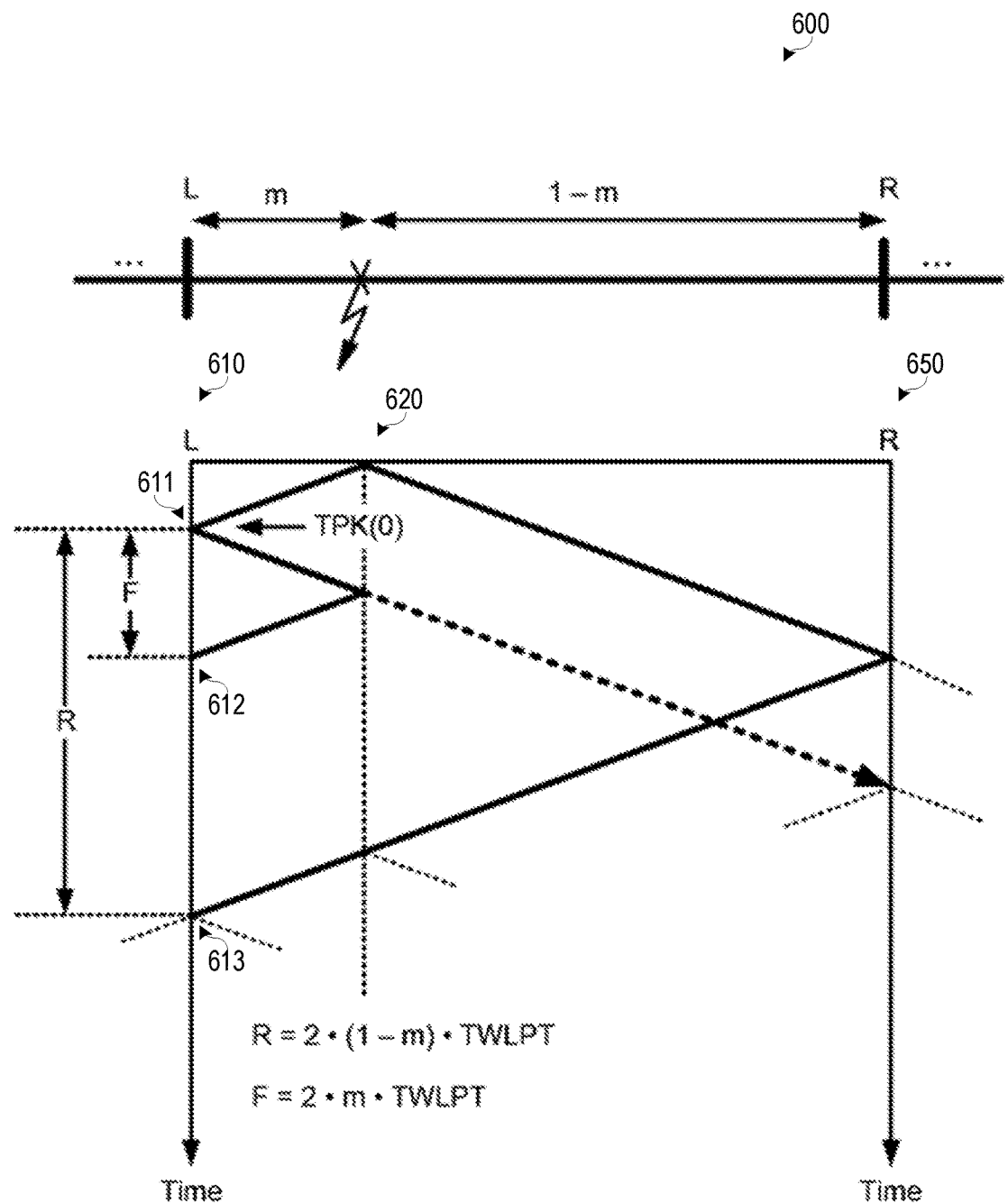
FIG. 6A illustrates a Bewley lattice diagram showing TPK(0), F(1), and R(1) based on a hypothesis associated with TPK(1), according to one embodiment.

FIG. 6A illustrates a Bewley lattice diagram showing TPK(0) 611, F(1) 612, and R(1) 613, where F(1) 612 and R(1) 613 are based on the first hypothesis TPK(1). The time difference between TPK(1) and TPK(0), F(1) is equal to 2*m*TWLPT, per Equation 3 above. R(1) is a calculated using Equation 4 as an expected reflection assuming the hypotheses TPK(1) is a correct hypothesis. The expected R(1) 613 reflection can be thought of as a "companion traveling wave" that, assuming the hypothesis TPK(1) is accurate, should correspond to one of the received TPK values. If no such TPK value is detected (i.e., no match is found), then a confidence level that the hypothesis is correct is decreased, as described below.

Returning to FIG. 5, the system may create a time difference vector, DT, that include all of the possible time differences using all TPKs in the observation window. That is, a set of time differences (DT set) or a time difference vector (DT) may be generated to include a plurality of difference elements. The difference elements included in the DT set (or DT vector) include all difference between all pair-combinations of TPKs. As a specific example: if the TPKs received during the observation window are A, B, C, D, E, and F, where A corresponds to the arrival time of the first traveling wave peak (VPK), then the DT set will include differences: (A-B), (A-C), (A-D), (A-E), (A-F), (B-C), (B-D), (B-E), (B-F), (C-D), (C-E), (C-F), (D-E), (D-F), and (E-F). The differences in the set may be expressed as absolute values and/or evaluated for matches independent of sign.

The system may determine, at 508, a count of the number of instances, NM(H), that the time differences in the vector DT match the calculated F(H). A match may be defined as a number that is within a predefined tolerance range, as defined by, for example, the TWTOL1 parameter (e.g., TWTOL1=10 μs). A first error, ERRM(H), may be calculated, at 510, for each hypothesis that corresponds to the NM(H) set.

The fault location system may determine, at 512, the number of instances, N1_M(H), that the time differences in the vector DT match the calculated R(H). Again, a match may be considered valid only if it is an exact match or if numbers are within a predefined tolerance range. A second error, ERR1_M(H), may be calculated, at 514, for each hypothesis that corresponds to the N1_M(H) set. A total error, ERR(H), may be calculated, at 516, by adding ERRM (H) and ERR1_M(H).

Figure 6B:
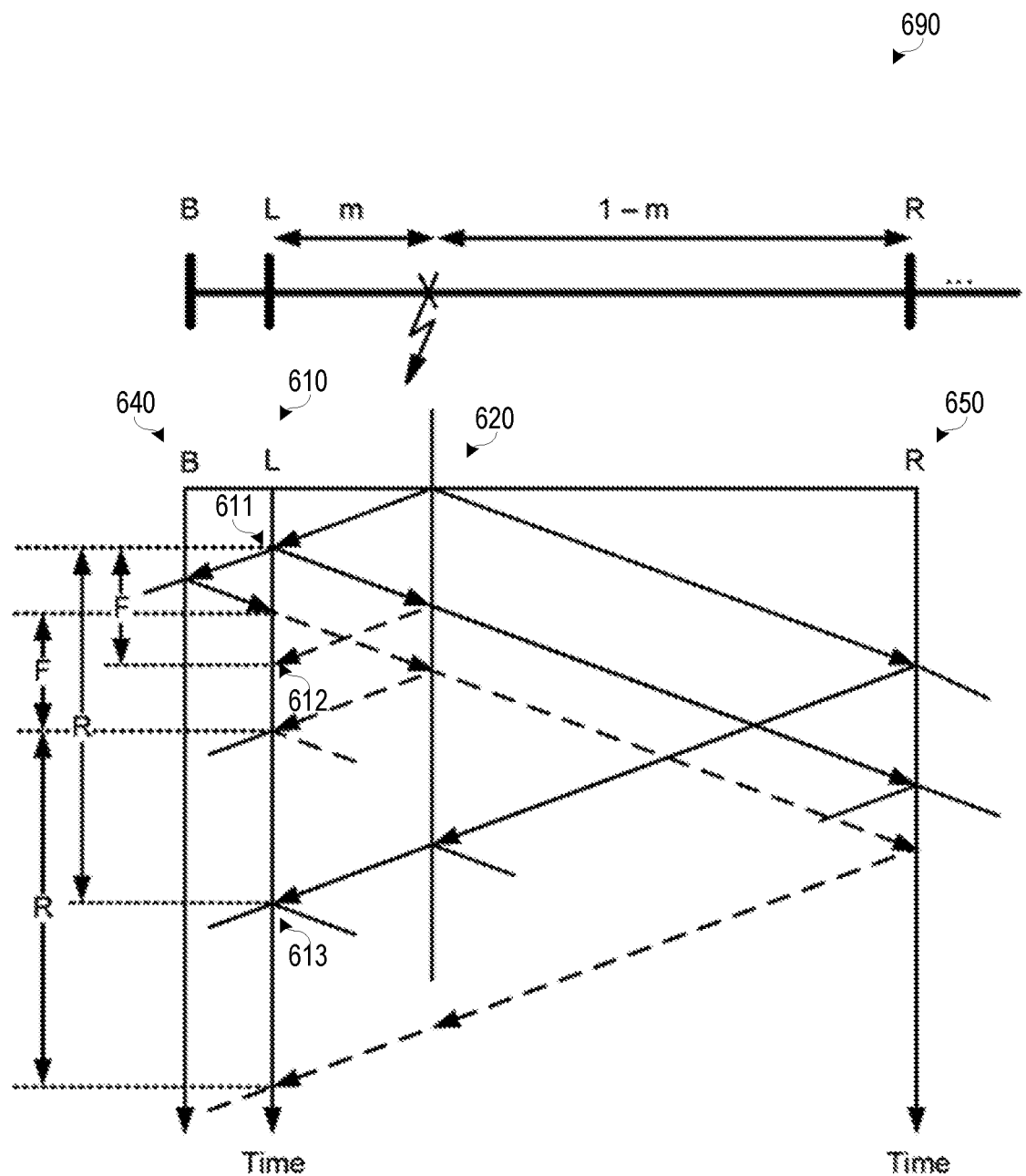
FIG. 6B illustrates a Bewley diagram with traveling waves in dashed lines that originate from substation reflections, according to one embodiment.

FIG. 6B illustrates traveling waves in dashed lines that are caused by reflections for a substation 640 that the system may utilize to determine the number of instances NM(H) and N1_M(H). One benefit of the RRT method described above is that the approach leverages available reflections from the external elements behind the local terminal (e.g., substation 240, FIG. 2).

Without exhaustively repeating the discussion above for the TPKs associated with the dashed lines in FIG. 6B, it is visually clear that the TPKs at the local terminal 610 corresponding to the dashed lines are similar to the solid lines discussed above for TPK(0) 611, F(1) 612, and R(1) 613, except the dashed lines are shifted downward in time by an amount of time equal to two times the traveling wave propagation between the local terminal L 610 and the point B in the substation 640.

Figure 7:
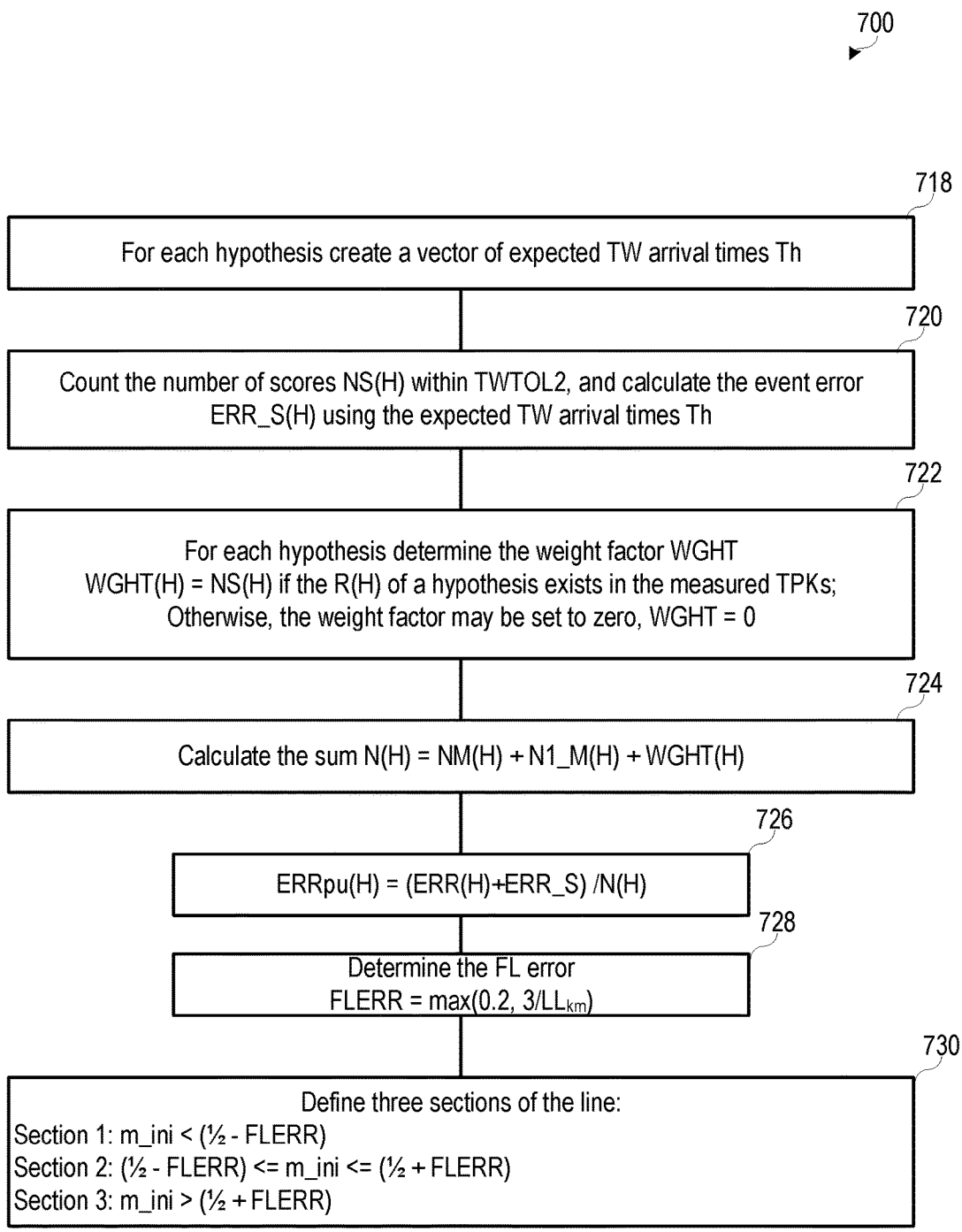
FIG. 7 illustrates a portion of a method for calculating expected traveling waves for each hypothesis.

FIG. 7 illustrates a method for calculating expected traveling waves (ETW) for each hypothesis. FIG. 7 also includes operations for evaluating each hypothesis using weighted values from the RRT and ETW approaches. The system may implement the ETW approach by calculating, at 718, a vector of expected traveling wave arrival times, Th, for each hypothesis. A set of ETWs may be used as an equivalent or similar data structure for a number of ETW elements. The vector of expected traveling wave arrival times, Th, may be based on: the distance to the fault, m; the TWLPT parameter; and the threshold, $t_{limit}$, from Equation 2. A vector of expected traveling wave arrival times, Th, may be calculated for each hypothesis based on a number of traveling wave sets as, for example:

$$\vec{T}_h = [TLSET1, TLSET2, TLSET3, TLSET4] - TLSET1(1) \quad \text{Equation 5}$$

The vector of expected traveling wave arrival times, Th, may include only those expected traveling waves within each of TLSET1, TLSET2, TLSET3, and TLSET4 that are within an observation window. TLSET1 corresponds to a pattern of TPK values for reflections from the fault to the local terminal, back to the fault, and then back to the local terminal (i.e., fault-local-fault-local).

Figure 8A:
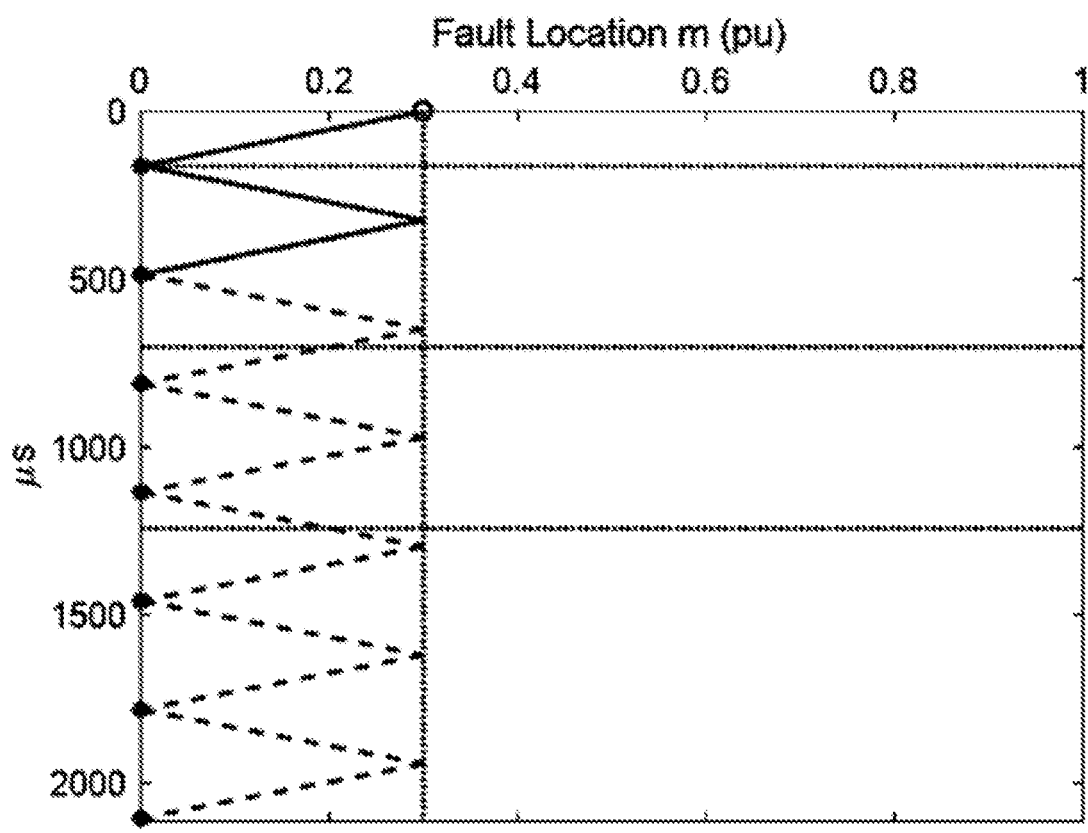
FIG. 8A illustrates an example of expected traveling waves from a fault-local-fault-local traveling wave reflection pattern in a Bewley lattice diagram.

FIG. 8A illustrates a fault-local-fault-local traveling wave reflection pattern with the fault at location m=0.3 pu on a 100-mile line (i.e. m=30 miles) with the TWLPT equal to 540 μs. Thus, the system may calculate TLSET1 as follows:

$$TLSET1 = k*m*TWLPT, k=1,3,5, \ldots \quad \text{Equation 6}$$

TLSET2 corresponds to the pattern of TPK values for reflections from the fault to the remote terminal, back to the fault, and then to the local terminal (i.e., fault-remote-fault-local).

Figure 8B:
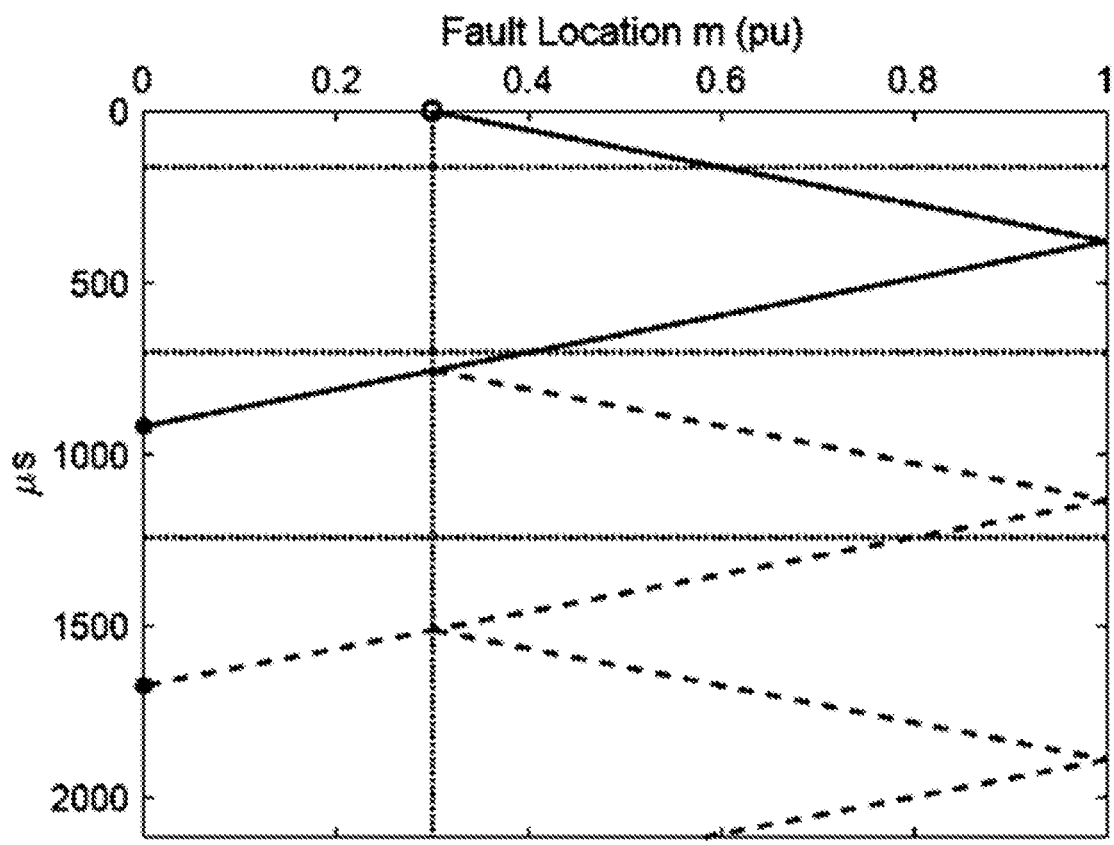
FIG. 8B illustrates an example of expected traveling waves from a fault-remote-fault-local traveling wave reflection pattern in a Bewley lattice diagram.

FIG. 8B illustrates a fault-remote-fault-local traveling wave reflection pattern with similar parameters to the line in FIG. 8A. Thus, the system may calculate TLSET2 as follows:

$$TLSET2 = 2*k*(1-m)*TWLPT, k=1,2,3, \ldots \quad \text{Equation 7}$$

TLSET3 corresponds to the pattern of TPK values for reflections from the local terminal to the fault, to the remote terminal, back to the fault, and to the local terminal (i.e., local-fault-remote-fault-local).

Figure 8C:
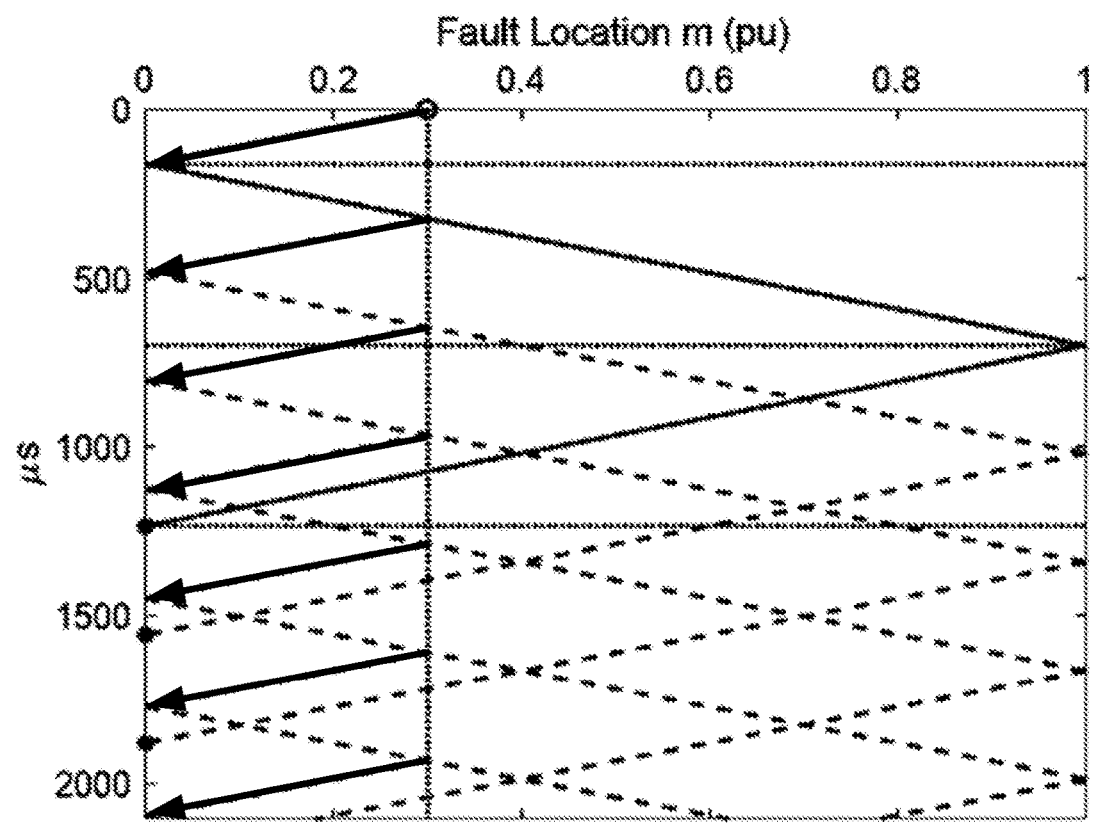
FIG. 8C illustrates an example of expected traveling waves from a fault-local-fault-remote-fault-local traveling wave reflection pattern in a Bewley lattice diagram.

FIG. 8C illustrates a local-fault-remote-fault-local traveling wave reflection pattern with similar parameters to the line in FIG. 8A. The solid line represents the first TLSET3 pattern. The dashed lines represent subsequent TLSET3 patterns. The system may calculate TLSET3 as follows:

$$TLSET3 = [k*m+2]*TWLPT, K=1,3,5, \ldots \quad \text{Equation 8}$$

TLSET4 corresponds to the pattern of TPK values for reflections from the fault to the local terminal, to the fault, to the remote terminal, back to the fault, back to the remote terminal, back to the fault, and then to the local terminal (i.e., fault-local-fault-remote-fault-remote-fault-local). Without belaboring the point with yet another drawing, the system may calculate TLSET4 as follows:

$$TLSET4 = [k*M+2(2-M)]*TWLPT, K=1,3,5, \ldots \quad \text{Equation 9}$$

Once the elements of TLSET1, TLSET2, TLSET3, and TLSET4 have been identified, the vector of expected traveling wave arrival times, Th, (or a set of ETWs) may be generated by filtering out elements with the same value, and elements that have values outside of the observation window. The elements in the vector of expected traveling wave arrival times, Th, may be sorted in ascending order to facilitate comparisons and/or decrease computations processing times.

Figure 9:
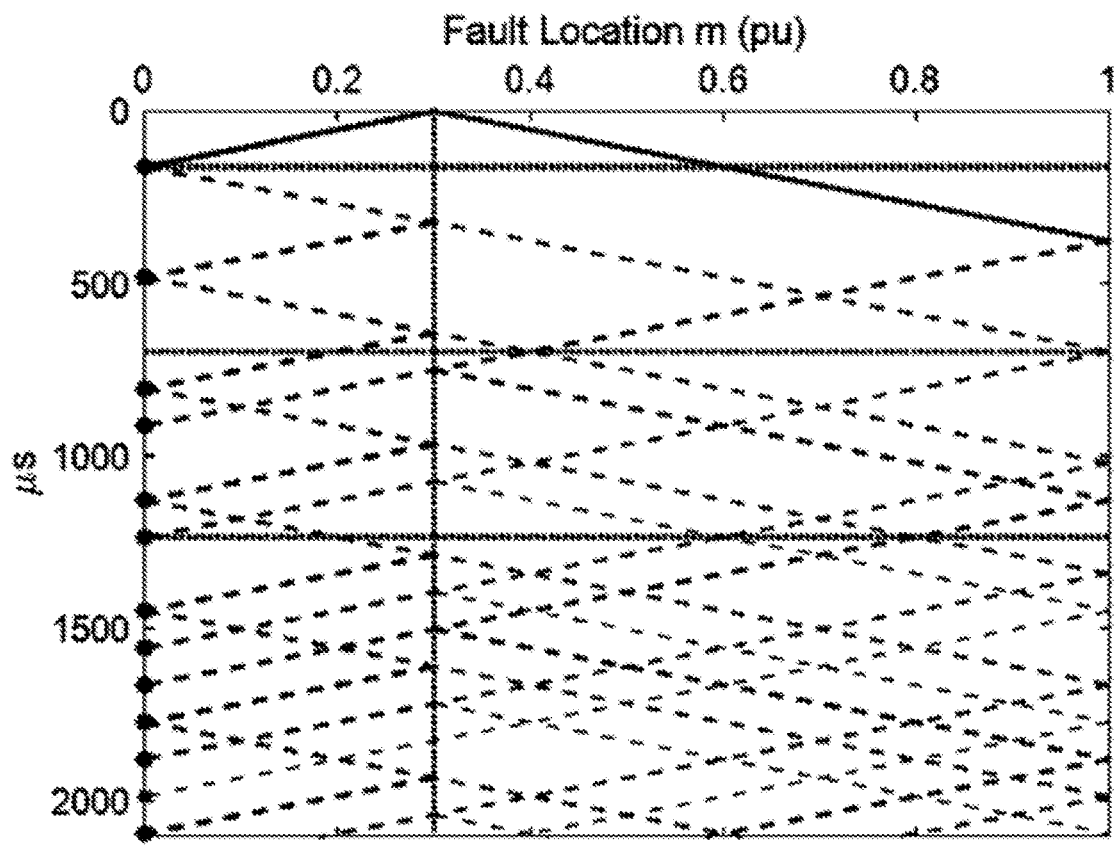
FIG. 9 a plurality of expected traveling waves at a local terminal for a vector of expected traveling wave arrival times, Th.

FIG. 9 illustrates all the expected TPK values in the vector of expected traveling wave arrival times, Th, for a hypothesis TPK associated with a fault location estimated at m=0.3.

Turning again to FIG. 7, the fault location system may then determine, at 720, a count of the number of TPKs in the TPK vector that match the vector of expected traveling wave arrival times, Th. Again, a match may be defined as an exact match or as a match within a tolerance range, such as a tolerance ranged defined by the TWTOL2 parameter. The number of matches or scores may be referred to as NS(H). in some embodiments, an event error, ERR_S(H) may be calculated as well.

The results of the RTT and/or EWT approaches may be evaluated to select a hypothesis as correct. The system may select a correct hypothesis based on a weighted function of the results of the RTT and/or EWT approaches and may optionally consider the respective error calculations. In embodiments that use both the ruler and the score evaluation approaches, the system may assign, at 722, a weighting factor WGHT(H) equal to NS(H) if the R(H) of each respective hypothesis corresponds to a TPK value within the TPK vector. Otherwise, the WGHT factor for a given hypothesis may be assigned to zero/null For each hypothesis, a sum N(H) may be calculated, at 724, as follows:

$$N(H) = NM(H) + N1\_M(H) + WGHT(H). \quad \text{Equation 10}$$

An error per event may be calculated, at 726, as follows:

$$ERRpu(H) = \frac{(ERR(H) + ERR\_S)}{N(H)} \qquad \text{Equation 11}$$

In other embodiments that use only the score or ETW evaluation approach, Equation 10 may be modified to ignore NM(H) and N1_M(H) and the weighting factor WGHT(H) may be unrelated to the match of R(H) values with TPK values within the TPK vector. Thus, for each hypothesis being evaluated by only the score evaluation approach, an equation for N(H) may be expressed as:

$$N(H) = NS(H) \qquad \text{Equation 10.1}$$

A fault location error of the initial estimate, FLERR, may be determined, at 728. For example, the FLERR may be determined as the greater of either 0.2 pu or three times the reciprocal of the line length. The power line may be conceptually divided, at 730, into three sections. The initial guess, m_ini, can be defined as being in one of the three sections as follows, for example:

Section 1: m_ini<(½−FLERR);
Section 2: (½−FLERR)<=m_ini<=(½+FLERR); and
Section 3: m_ini>(½+FLERR).

Figure 10:
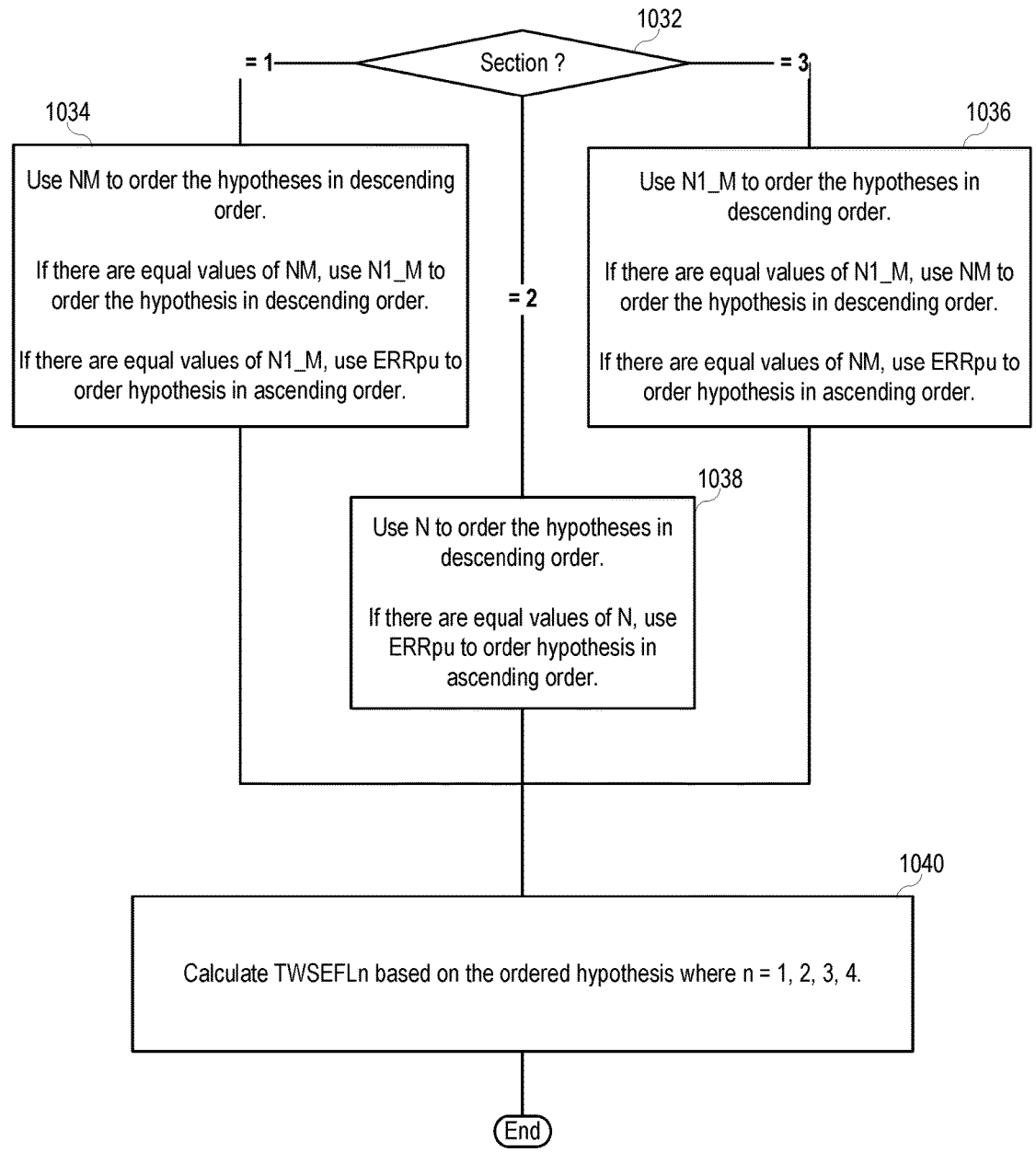
FIG. 10 illustrates a portion of a method for calculating a fault location based on evaluated hypotheses, according to one embodiment.

FIG. 10 continues the method of FIG. 7 and branches, at 1032, based on the section within which m_ini is located. For instance, if m_ini is in Section 1, at 1034, then the hypothesis with the greatest NM is used. If there are equal values of NM, N1_M can be used to order the hypotheses in descending order. If there are an equal number of N1_M values, then the ERRpu can be used to order the hypotheses in ascending order.

If m_ini is in Section 3, at 1036, the hypothesis with the greatest N1_M is used. If there are equal values of N1_M, NM can be used to order the hypotheses in descending order. If there are an equal number of NM values, then the ERRpu can be used to order the hypothesis in ascending order.

If m_ini is in Section 2, at 1038, the hypothesis with the greatest N is used. If there are equal values of N, then the ERRpu can be used to order the hypothesis in ascending order.

The fault location system can then calculate, at 1040, TWSEFLn, based on the ordered hypotheses, where n=1, 2, 3 and 4 as:

$$TWSEFLn = \frac{LL * DTn}{2 * TWLPT} \qquad \text{Equation 12}$$

Using the F(H) notation described above, Equation 12 can alternatively be expressed as:

$$TWSEFLn = \frac{LL * F(H)}{2 * TWLPT} \qquad \text{Equation 12.1}$$

If m_ini is in Section 1, the calculated distance to the fault, m, should be less than 0.3, or it is set to N/A. If m_ini is in section 3, the calculated distance to the fault should be between 0.7 and 1.0, or it is set to N/A.

Figure 11:
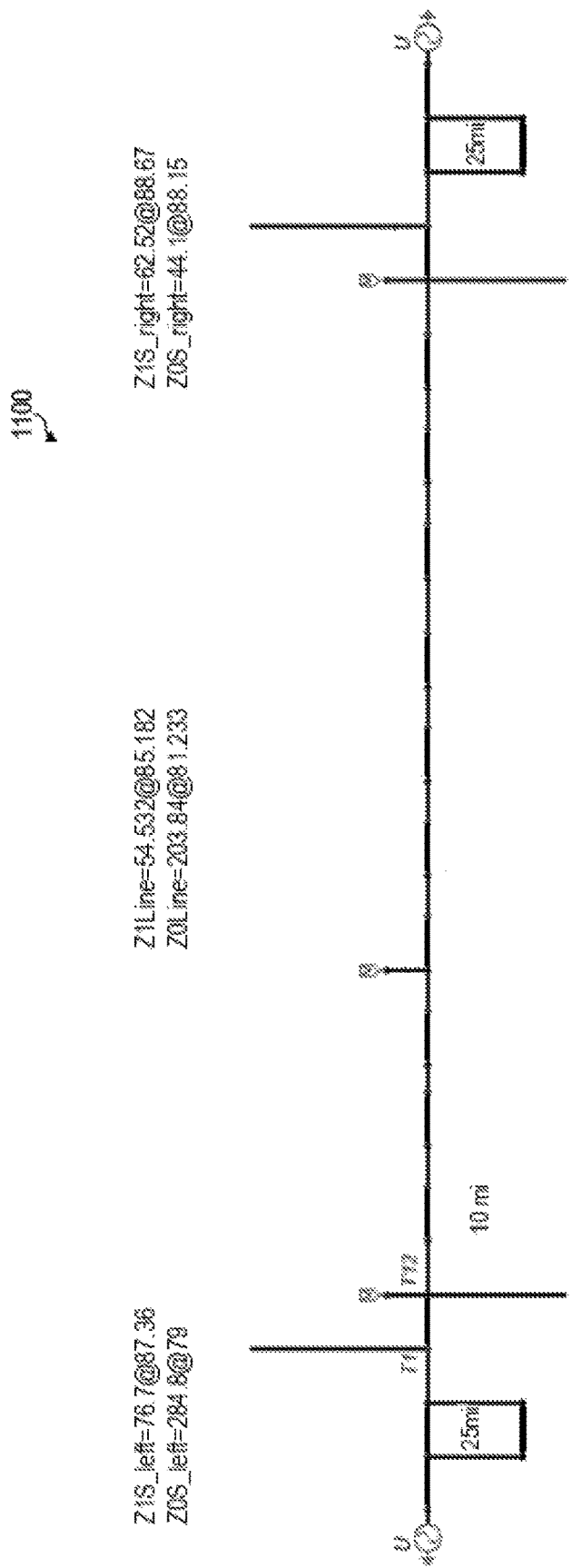
FIG. 11 provides a schematic diagram for a simulation to illustrate a specific example of the systems and methods described herein, according to one embodiment.

FIG. 11 provides a schematic diagram 1100 for a simulation to illustrate a specific example of the systems and methods described herein. The description below uses actual data from a simulation of the schematic diagram 1100 and is intended to provide a specific example of the systems and methods described above and is not intended to be limiting in any way.

The schematic diagram 1100 simulates an AG fault at 30% of a 100-mile transmission line with a TWLPT of 540 µs. The schematic diagram 1100 also includes two 25-mile parallel lines connected to the two-line terminals (TWLPT=135 µs) and two sources behind the parallel lines.

Figure 12:
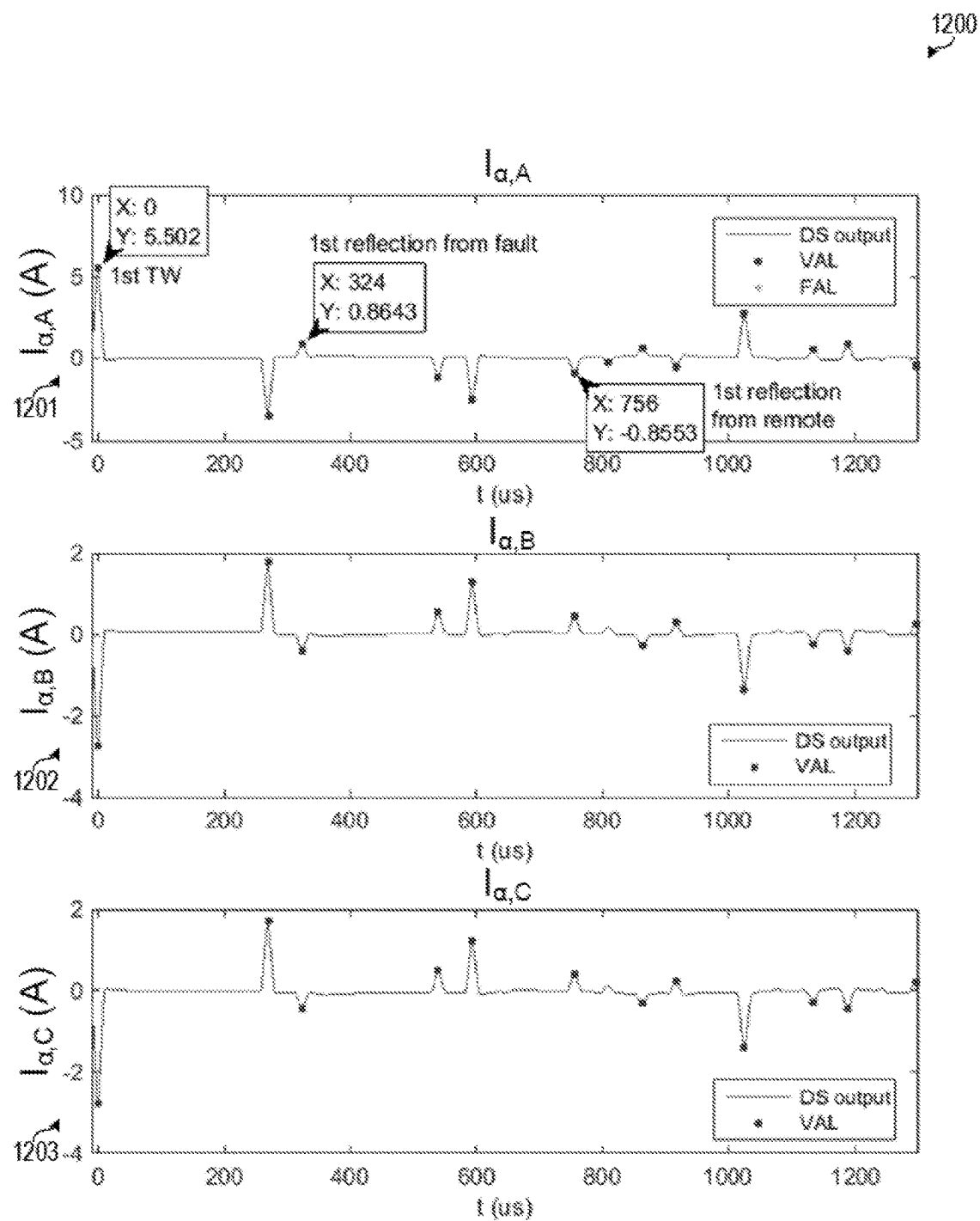
FIG. 12 illustrates the alpha currents, smoothed via a differentiator smoother, for the simulated fault with the corresponding VAL or FAL indications for each peak.

FIG. 12 illustrates the alpha currents 1200 after being processed by a differentiator smoother for the simulated fault with the corresponding VAL or FAL indication for each peak. VAL or FAL value of logic one indicates that the traveling wave peak is a suitable input for the TWSEFL algorithm.

The data acquisition circuitry (including, for example, data acquisition module 140, FIG. 1A) obtains the time stamps from alpha signal A 1201, alpha signal B 1202, and alpha signal C 1203. For this line, the observation window of the data buffer may be, for example, 2.4*TWLPT (2.4*540 µs=1296 µs). For the signals in FIG. 12, the data buffer provides the following outputs:

For alpha signal A 1201:
IATP=[51074, 51344, 51398, 51613, 51668, 51830, 51883, 51938, 51992, 52100, 52207, 52262].
IAVAL=[1, 1, 1, 1, 1, 1, 1, 1, 1, 1, 1, 1]
IAFAL=[0, 0, 0, 0, 0, 0, 0, 0, 0, 0, 0, 0]
For alpha signal B 1202:
IBTP=[51074, 51344, 51398, 51613, 51668, 51830, 51830, 51938, 51992, 52100, 52207, 52262].
IBVAL=[1, 1, 1, 1, 1, 1, 1, 1, 1, 1, 1, 1]
IBFAL=[0, 0, 0, 0, 0, 0, 0, 0, 0, 0, 0, 0]
For alpha signal C 1203:
ICTP=[51074, 51344, 51398, 51613, 51668, 51830, 51830, 51938, 51992, 52100, 52207, 52262].
ICVAL=[1, 1, 1, 1, 1, 1, 1, 1, 1, 1, 1, 1]
ICFAL=[0, 0, 0, 0, 0, 0, 0, 0, 0, 0, 0, 0]

The system may calculate the raw time stamps, ITP, in microseconds as follows:

$$ITPn = \frac{IATPn \cdot (IAVALn + IAFALn) + IBTPn \cdot (IBVALn + IBFALn) + ICTPn \cdot (ICVALn + ICFALn)}{(IAVALn + IAFALn) + (IBVALn + IBFALn) + (ICVALn + ICFALn)} \qquad \text{Equation 13}$$

In Equation 13 above, n is the index referring to the corresponding record. In the illustrated embodiment, the system determines 12 records with the following time stamps: ITP=[51074, 51344, 51398, 51613, 51668, 51830, 51883, 51938, 51992, 52100, 52207, 52262].

The system identifies that the first traveling wave peak (VPK) is received at an arrival time (TPK) equal to 51074 µs in mode 1, corresponding to the alpha mode. As described above, close-proximity peaks are removed by removing values within close proximity (e.g., as defined by a TWDSW parameter, such as 10 µs) of the identified first traveling wave. Because the next ITP value (51344) is more than 10 µs from the identified first traveling wave, no ITP values are filtered.

The resulting ENUM (modal number) is 1, which indicates the fault is an AG fault. The system retrieves all three phase currents and reconstructs the alpha traveling wave signals. Using these signals, the algorithm interpolates the raw time stamps ITP, which are in microseconds, to obtain more precision with interpolated ITPI time stamps in nanoseconds. In some embodiments, if the interpolated ITPI data is different than the raw ITP data by more than a threshold amount (e.g., 2 µs), then the ITP data may be used instead.

FIG. 14 illustrates a table with the interpolated time stamps ITPI, and their corresponding estimated magnitudes, IMAG, for the simulation. The system may reference the interpolated TPKs (ITPIs) to the first traveling wave time stamp as illustrated in FIG. 15.

The system may then determine the sign TPSIGN of each peak with respect to the first VPK using the signed VPK value of each peak, as illustrated in FIG. 16.

The system may then generate a time difference vector, DT, from the interpolated TPK vector. The time difference vector, DT, may be equivalently described as a set of time difference values, DT, instead of as a vector. The length of the time difference vector, DT, corresponds to the number of combinations of TPKs taken two at a time (i.e., pair-combinations). Thus, the length of the time difference vector is: (11+1)*11/2=66). For this simulation, the time difference vector, DT, is:

DT=[53.348, 53.961, 54.066, 54.082, 54.156, 54.191, 107.453, 107.539, 108.152, 108.453, 161.500, 161.609, 162.414, 162.438, 215.785, 215.797, 215.906, 216.520, 216.605, 269.863, 269.867, 269.867, 269.879, 269.953, 269.977, 270.031, 270.063, <u>323.938</u>,<u>323.945</u>,<u>324.023</u>,<u>324.059</u>,<u>324.059</u>,<u>324.098</u>, 377.406, 378.020, 378.215, 431.563, 432.316, 432.391, 485.664, 486.383, 486.473, 539.730, 539.844, 539.855, 539.895, 593.816, 593.922, 593.926, 593.977, 594.000, 647.883, 648.082, 702.270, <u>756.336</u>,<u>756.414</u>, 809.723, 809.762, 863.789, 863.879, 863.953, 917.914, 917.945, 1026.367, 1133.820, 1187.977].

Based on the polarity check and the TWLPT, the first reflection from fault should be less than 2*TWLPT+10 µs (i.e., 2*540+10=1090 µs), where the 10 µs represents an example threshold for increasing inclusivity. In this case, the system identifies three hypotheses (underlined and bolded in FIG. 16).

The system may utilize the ruler evaluation approach and/or the score evaluation approach to detect valid reflections. Using the ruler evaluation (RTT evaluation) approach for each hypothesis, the system calculates two time references. A first reference corresponds to the reflection from the fault, F(H), and the second reference corresponds to the reflection from the remote terminal, R(H).

As illustrated in FIG. 17, the reflection from the fault F(H) for the first hypothesis is F(1)=324.098 and the associated reflection from the remote terminal R(H) for the first hypothesis is R(1)=755.902. The system may count the number of matches of F(H) with time differences in the time difference vector DT to determine NM(H), and count the number of matches of R(H) with time differences in the time difference vector DT to determine N1_M(H). As illustrated, in FIG. 17, there are six matches for F(H) in the time difference vector DT and two matches for R(H) in the time different vector DT for the first hypothesis. The six matches for F(H) are underlined in the DT vector above. The two matches for R(H) are double underlined in the DT vector above. The system may also calculate the total errors for NM(H) and N1_M(H) within TWTOL1, as shown in FIG. 18.

In some embodiments, a hypothesis may be selected as "correct" or as the "best" hypothesis based on the hypothesis having the greatest number of NM matches, the greatest number of N1_M matches, and/or the greatest total number of matches NM+N1_M. In other embodiments, the score evaluation (ETW evaluation) approach may be used in addition to the ruler or RTT evaluation approach to select a "correct" or "best" hypothesis. In still other embodiments, the score evaluation (ETW evaluation) approach may be used by itself without the ruler or RTT evaluation approach. In such an embodiment, the weighting of the scores NS(H) based on a TPK match for R(H) would be irrelevant and so would be ignored and/or not calculated (See, e.g., Equation 10.1).

Regardless, a selected hypothesis may be used to calculate a location of the fault relative to the local terminal. Whether the RRT method is used alone or in combination with the ETW evaluation approach, a hypothesis can be selected based on a function of the NM and NM_1 values for each of the evaluated hypotheses.

Using the score evaluation (ETW evaluation) approach, a set or vector of expected traveling wave arrival times, Th, is determined that includes a plurality of expected arrival times of traveling waves (ETWs) for each hypothesis. The ETWs are compared with the actual received TPK values in the TPK vector to identify matches that are within TWTOL2 (e.g. TWTOL2=5 µs). In some embodiments, when the system creates the vector of expected traveling wave arrival times, Th, the system may remove close-proximity values.

FIG. 19 shows the TPK matches for each hypothesis per the associated vectors of expected traveling wave arrival times, Th. The expected traveling wave arrival times are in the third, fourth, and fifth columns corresponding to the vectors of expected traveling wave arrival times, Th, for each of the first, second and third hypotheses, respectively. The expected times corresponding to F(H) are underlined, and the expected times corresponding to R(H) are double underlined. The strikethrough values are the values that are within TWDSW and may be removed or not considered. The boxed and bolded value can be used for supervision of R(H).

Figure 20:
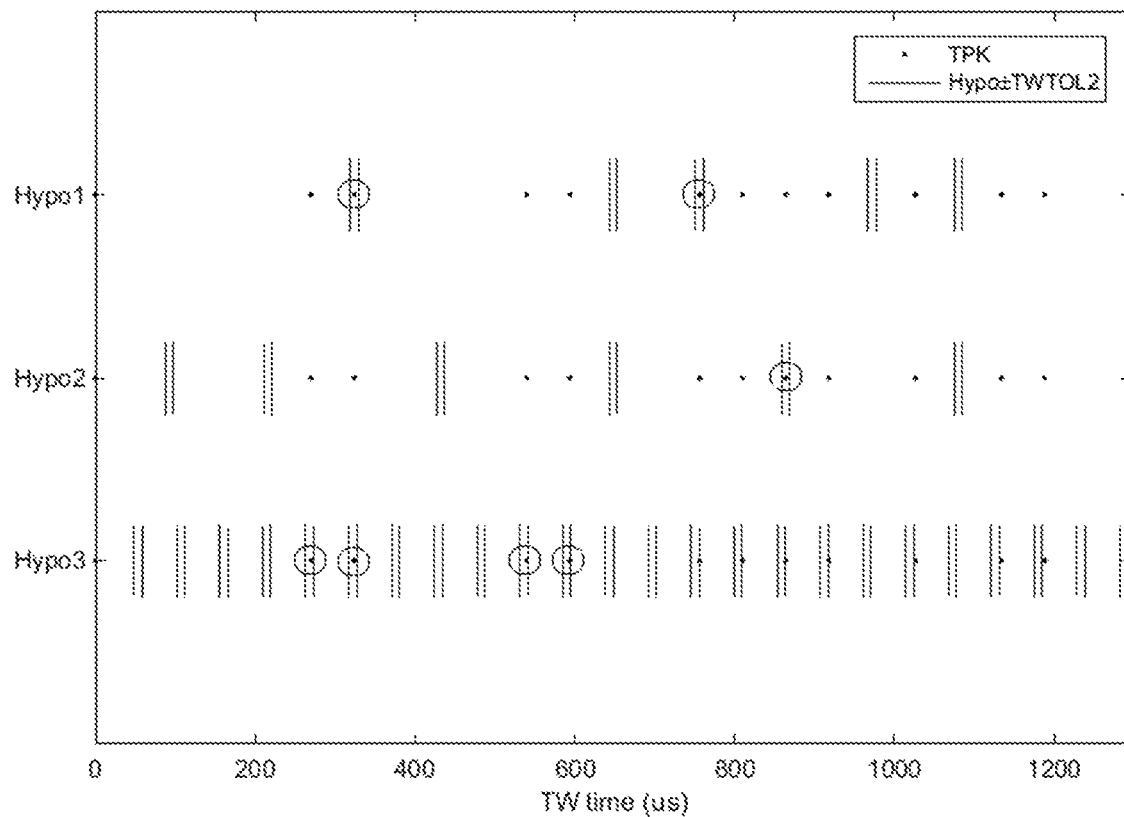
FIG. 20 illustrates a graphical representation of the measured TPKs and the arrival times of expected traveling waves (ETWs) for three hypotheses with matches identified by circles.

FIG. 20 shows the measured TPKs and the expected traveling waves for each of the three hypotheses. Matches are identified between the TPK measurements and the calculated hypotheses of the vector of expected traveling wave arrival times, Th. The circles identify the matches between TPK and hypotheses within TWTOL2 (5 µs in this simulation).

FIG. 21 illustrates a table showing the number of matches/scores NS(H) for each hypothesis.

FIG. 22 illustrates the total errors for NS(H) within TWTOL2 (e.g. 5 µs), as calculated by the system.

The system may identify one or more matches between R(H) and F(H) within TWTOL1 (e.g. 10 µs) for a corresponding hypothesis. For example, if F(H)=324.098, R(H)=2*TWLPT-F=2*540-324.098=755.902. The system may identify 756.414 in the TPK column (boxed and bolded in FIG. 14) and then NS(H)=2(matches)*1 (supervision logic)=2.

FIG. 23 is a table showing the weight (WGHT) for each hypothesis based on a match of R(H) with a received TPK. In embodiments in which the score algorithm is used in combination with the ruler algorithm, the output of the score algorithm may be weighted based on a match of R(H) with a received TPK. In embodiments in which the score evaluation approach is used alone, no such weighting may be available or used.

The variable N can be defined as a figure of merit that indicates how closely the received TPKs match the expected TPKs for a fault location calculated based on a given hypothesis. The N values can be calculated using Equation 10 above. A total per unit error can also be calculated for each hypothesis using Equation 11 above.

FIG. 24 includes a table with the N values and the total per unit error, ERRpu, for each of the three hypotheses.

As previously described, the system may define three line sections as follows:

Section 1: m_ini<0.3
Section 2: 0.3<=m_ini<=0.7; and
Section 3: m_ini>0.7,

As described above, the default initial guess when other data is unavailable is m_ini=0.5, and so the m_ini falls within Section 2. Therefore, the system assumes that the fault is in Section 2. For faults in Section 2, the algorithm uses N (and optionally ERRpu in the event of a tie) to order the hypotheses, as follows: TWSE=[0.3, 0.8, 0.95, NA].

The traveling wave single-ended fault location, TWSEFL, for hypothesis 1 can be calculated per Equation 12.1 above as:

$$TWSEFL_1 = LL * \frac{F(1)}{2*TWLPT} = (100*324.098)/(2*540) = 30.009 \text{ miles.}$$

Figure 25:
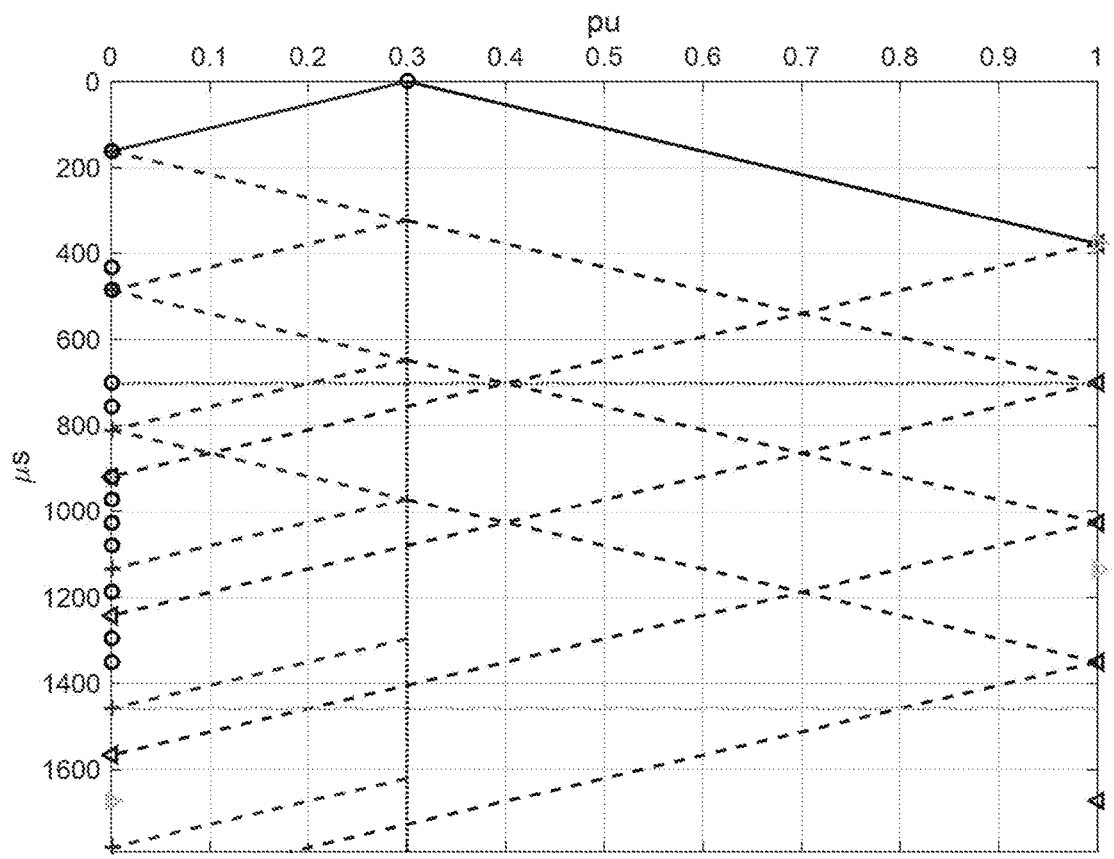
FIG. 25 shows the expected reflections for a fault at m=0.3 and the corresponding TPK measurements as circles.

FIG. 25 shows the expected reflections for a fault at m=0.3 and the TPK measurements shown with circles that match the received TPK values above for this simulation.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention(s) should, therefore, be interpreted to encompass at least the following claims:

The invention claimed is:

1. A system to determine a relative location of a fault in a power line of an electric power delivery system comprising:
   a traveling wave detector in electrical communication with the power line of the electric power delivery system to:
      detect an arrival time (TPK) and associated peak amplitude (VPK) of each of a plurality of traveling waves received at a first location on the power line, and
      identify hypothesis TPKs as TPKs corresponding to traveling waves detected after a first detected traveling wave that have the same polarity as the first detected traveling wave; and
   a fault location determination subsystem comprising at least one processor and a memory to:
      calculate a set of expected traveling wave arrival times (ETWs) for each hypothesis;
      determine a first number of matches (NS) of the ETWs of each hypothesis with the detected TPKs;
      calculate a merit value (N) of each of the hypotheses based on a function of the number of matches (NS) of each respective hypothesis;
      select one of the hypotheses based on the merit value (N); and
      calculate a location of the fault relative to the first location based on the length of the power line, a traveling wave line propagation time (TWLPT), and the selected hypothesis.

2. The system of claim 1, wherein the traveling wave detector is configured to detect the TPKs and corresponding peak amplitude VPKs of each of the traveling waves detected within an observation window.

3. The system of claim 1, wherein the hypothesis with the greatest number of matches (NS) is the selected hypothesis.

4. The system of claim 1, wherein the first number of matches (NS) comprises identifying detected TPKs and calculated ETWs that are within a threshold range of one another.

5. The system of claim 1, wherein the fault location determination subsystem is configured to calculate the location of the fault based on a distance from the first location to the fault location that is equal to one-half the length of the power line, multiplied by the selected hypothesis, divided by the TWLPT.

6. The system of claim 1, wherein the traveling wave detector is configured to detect only those TPKs and VPKs of the traveling waves at the first location on the power line within an observation window.

7. The system of claim 6, wherein the observation window includes TPKs and VPKs of traveling waves received until a time equal to TWOBSW*TWLPT after the first received traveling wave, where TWOBSW is an observation window coefficient.

8. A method of calculating a relative location of a fault in a power line of an electric power delivery system comprising:
    detecting, via a detector in electrical communication with the power line of the electric power delivery system, an arrival time (TPK) and peak amplitude (VPK) of each of a plurality of traveling waves at a first location on the power line;
    identifying TPKs corresponding to VPKs detected after a first detected traveling wave that have the same polarity as the first detected traveling wave as hypotheses;
    calculating, via a processor, a set of expected traveling wave arrival times (ETWs) for each hypothesis;
    determining a first number of matches (NS) of the ETWs of each hypothesis with the detected TPKs;
    calculating a merit value (N) of each of the hypotheses based on a function of the number of matches (NS) of each respective hypothesis;
    selecting one of the hypotheses based on the merit value (N); and
    calculating a location of the fault relative to the first location based on the length of the power line, a traveling wave line propagation time (TWLPT), and the selected hypothesis.

9. The method of claim 8, wherein the hypothesis with the greatest number of matches (NS) has the highest merit value (N), and wherein the hypothesis with the highest merit value (N) is the selected hypothesis.

10. The method of claim 8, wherein determining the first number of matches (NS) comprises identifying detected TPKs and calculated ETWs that are within a threshold range of one another.

11. The method of claim 8, wherein calculating the location of the fault relative to the first location comprises calculating a distance from the first location to the location of the fault by multiplying one-half the length of the power line by the selected hypothesis divided by the TWLPT.

12. The method of claim 8, wherein detecting, the TPKs and VPKs of each of the plurality of traveling waves at the first location on the power line comprises only detecting those VPKs and TPKs within an observation window.

13. The method of claim 12, wherein the observation window includes TPKs and VPKs received until a time equal to TWOBSW*TWLPT after the first detected traveling wave, where TWOBSW is an observation window coefficient.

14. The method of claim 8, further comprising:
    calculating a fault reflection value, F(H), for each hypothesis.

15. The method of claim 14, wherein calculating the F(H) of each hypothesis comprises determining a time difference between the hypothesis and the TPK of the first detected traveling wave.

16. The method of claim 14, wherein detecting the TPKs of each of the traveling waves received after the first detected traveling wave comprises detecting each TPK relative to the TPK of the first detected traveling wave, such that the F(H) of a hypothesis TPK is equal to the hypothesis TPK.

17. The method of claim 14, further comprising:
    assigning a weight factor (WGHT) to each hypothesis equal to:
        the NS associated with each hypothesis for which the associated R(H) corresponds to one detected TPK associated with the fault reflection value F(H), and
        zero (0) for each hypothesis for which the associated R(H) value does not correspond to any detected TPK associated with the fault reflection value F(H).

18. The method of claim 14, further comprising:
    calculating a remote reflection value, R(H), for each hypothesis;
    determining a second number of matches (NM) of the F(H) of each hypothesis with a set of time differences (DT set) between pair-combinations of the detected TPKs received after the first detected traveling wave; and
    determining a third number of matches (N1_M) of the R(H) with the time differences in the DT set.

19. The method of claim 18, wherein calculating the R(H) of each hypothesis comprises determining the difference between twice the TWLPT and the F(H) value of the respective hypothesis, such that for each hypothesis: $R(H) = 2*TWLPT - F(H)$.

20. The method of claim 14, further comprising:
    assigning a weight factor (WGHT) to each hypothesis equal to:
        the NS associated with each hypothesis for which the associated R(H) corresponds to one detected TPK, and
        zero (0) for each hypothesis for which the associated R(H) value does not correspond to any detected TPK; and
    calculating a remote reflection value, R(H), for each hypothesis;
    determining a second number of matches (NM) of the F(H) of each hypothesis with a set of time differences (DT set) between pair-combinations of the detected TPKs received after the first detected traveling wave; and
    determining a third number of matches (N1_M) of the R(H) with the time differences in the DT set;
    calculating the sum of the second number of matches (NM), the third number of matches (N1_M), and the weight factor (WGHT) as an adjusted merit value (N) equal to (NM+N1_M+WGHT), and
    wherein selecting the hypotheses based on the merit value (N) comprises selecting the hypothesis determined to have the highest adjusted merit value.

21. A computer-implemented method, comprising:
    detecting, via a detector in electrical communication with a power line of a electric power delivery system, an arrival time (TPK) and peak amplitude (VPK) of each of a plurality of traveling waves at a first location on the power line of the electric power delivery system; and
    identifying TPKs corresponding to traveling waves detected after a first detected traveling wave that have the same polarity as the first detected traveling wave as hypotheses;
    calculating, via a processor, a set of expected traveling wave arrival times (ETWs) for each hypothesis;

identifying a first number of matches (NS) of the calculated ETWs with the detected TPKs;
calculating a fault reflection value, F(H), for each hypothesis;
calculating a remote reflection value, R(H), for each hypothesis;
determining a second number of matches (NM) of the F(H) of each hypothesis with a set of time differences (DT set) between pair-combinations of the detected TPKs received after the first detected traveling wave;
determining a third number of matches (N1_M) of the R(H) with the time differences in the DT set;
selecting one of the hypothesis based on at least one of NS, NM, and N1_M; and
calculating a distance from the first location to the fault location based on a function of the length of the power line, a traveling wave line propagation time (TWLPT), and the selected hypothesis.

22. The computer-implemented method of claim 21, further comprising:
determining an initial guess of a relative location of a fault (m_ini) as being within one of a first, second, and third section of a power line; and
prioritizing the hypothesis in a priority order based on:
NM, where m_ini is determined to be within the first section,
N, where m_ini is determined to be within the second section, and
N1_M, where m_ini is determined to be within the third section,
wherein selecting one of the hypotheses based on at least one of NS, NM and N1_M comprises selecting the hypothesis with the highest priority.

23. The computer-implemented method of claim 22, wherein the m_ini is determined to be within one of the first, second, and third sections based on information received from one of: a multi-end traveling wave fault location estimation system, a multi-end impedance fault location estimation system, and a single-end impedance fault location estimation system.

* * * * *